(12) United States Patent
Miyake et al.

(10) Patent No.: US 10,375,329 B2
(45) Date of Patent: *Aug. 6, 2019

(54) IMAGING DEVICE INCLUDING PHOTOELECTRIC CONVERSION LAYER

(71) Applicant: Panasonic Intellectual Property Management Co., Ltd., Osaka (JP)

(72) Inventors: Yasuo Miyake, Osaka (JP); Masashi Murakami, Kyoto (JP); Tokuhiko Tamaki, Osaka (JP); Yoshiaki Satou, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/963,410

(22) Filed: Apr. 26, 2018

(65) Prior Publication Data

US 2018/0249101 A1    Aug. 30, 2018

Related U.S. Application Data

(63) Continuation of application No. 15/719,456, filed on Sep. 28, 2017, now Pat. No. 9,986,182, which is a
(Continued)

(30) Foreign Application Priority Data

Dec. 3, 2015 (JP) .................................. 2015-236858

(51) Int. Cl.
  H04N 5/335  (2011.01)
  H04N 5/353  (2011.01)
(Continued)

(52) U.S. Cl.
  CPC ........ *H04N 5/353* (2013.01); *H01L 27/14609* (2013.01); *H01L 27/14612* (2013.01);
  (Continued)

(58) Field of Classification Search
  CPC .................................................. H04N 5/35554
  See application file for complete search history.

(56) References Cited

U.S. PATENT DOCUMENTS

| 9,386,248 B2 | 7/2016 | Ohtsuki et al. |
| 9,773,825 B2 | 9/2017 | Hirase et al. |

(Continued)

FOREIGN PATENT DOCUMENTS

| JP | H02-194779 A | 8/1990 |
| JP | 2002-152602 A | 5/2002 |

(Continued)

OTHER PUBLICATIONS

International Search Report of PCT application No. PCT/JP2016/004868 dated Feb. 14, 2017 with English translation.

*Primary Examiner* — Gary C Vieaux
(74) *Attorney, Agent, or Firm* — McDermott Will & Emery LLP

(57) ABSTRACT

An imaging device including: unit pixel cells each including a first electrode, a second electrode, a photoelectric conversion layer, a charge accumulation region connected to the first electrode, and a signal detection circuit connected to the charge accumulation region; and a voltage supply circuit connected to the second electrode, the voltage supply circuit supplying a first voltage to the second electrode in a first period, the voltage supply circuit supplying a second voltage that is different from the first voltage to the second electrode in a second period. Each unit pixel cells includes a reset transistor which switches between supply and cutoff of a reset voltage initializing the charge accumulation region,
(Continued)

and a potential difference between the first electrode and the second electrode when the reset voltage is supplied is greater than a potential difference between the first electrode and the second electrode after the reset voltage is cut off.

20 Claims, 13 Drawing Sheets

Related U.S. Application Data continuation of application No. PCT/JP2016/004868, filed on Nov. 11, 2016.

(51) Int. Cl.
*H01L 27/146* (2006.01)
*H04N 5/355* (2011.01)
*H04N 5/369* (2011.01)
*H04N 5/378* (2011.01)

(52) U.S. Cl.
CPC .. *H01L 27/14636* (2013.01); *H01L 27/14643* (2013.01); *H01L 27/14669* (2013.01); *H04N 5/3532* (2013.01); *H04N 5/35554* (2013.01); *H04N 5/3698* (2013.01); *H04N 5/378* (2013.01); *Y02E 10/549* (2013.01)

(56) References Cited

U.S. PATENT DOCUMENTS

| | | | |
|---|---|---|---|
| 9,812,491 | B2 | 11/2017 | Tamaki et al. |
| 2007/0013798 | A1 | 1/2007 | Ahn et al. |
| 2013/0277536 | A1 | 10/2013 | Mizuno et al. |
| 2014/0139712 | A1 | 5/2014 | Yamamoto et al. |
| 2015/0009397 | A1 | 1/2015 | Yamamoto et al. |
| 2017/0328776 | A1* | 11/2017 | Shimasaki ............ G01J 5/0853 |

FOREIGN PATENT DOCUMENTS

| | | |
|---|---|---|
| JP | 2006-094263 A | 4/2006 |
| WO | 2012/086123 A1 | 6/2012 |
| WO | 2012/164829 A1 | 12/2012 |
| WO | 2014/103169 A1 | 7/2014 |

* cited by examiner

IMAGING DEVICE INCLUDING PHOTOELECTRIC CONVERSION LAYER

RELATED APPLICATIONS

This application is a continuation of U.S. patent application Ser. No. 15/719,456, filed on Sep. 28, 2017, which is a continuation of International Application No. PCT/JP2016/004868, filed Nov. 11, 2016, which in turn claims the benefit of Japanese Application No. 2015-236858, filed on Dec. 3, 2015, the disclosures of which are incorporated in their entirety by reference herein.

BACKGROUND

1. Technical Field

The present invention relates to an imaging device.

2. Description of the Related Art

Heretofore, image sensors using photoelectric conversion have been known. For example, complementary metal oxide semiconductor (CMOS) type image sensors that have photodiodes are in widespread used. CMOS type image sensors have features such as low power consumption, and accessibility to individual pixels. CMOS type image sensors generally use the so-called rolling shutter method, where exposure and signal charge readout is performed in increments of rows of the pixel array, as the signal readout method.

In rolling shutter operations, the starting time and ending time of exposure differs for each pixel array row. Accordingly, in a case of shooting an object moving at high speed, a distorted image may be obtained as the image of the object, and when using a flash, there may be difference in brightness throughout the image. In light of this situation, there is demand for so-called global shutter functions, where all pixels in the pixel array start and end exposure together.

For example, U.S. Patent Application Publication No. 2007/0013798 discloses a CMOS type image sensor capable of global shutter operations. The technology described therein provides a transfer transistor and a charge storage unit (a capacitor or a diode) to each of multiple pixels. The charge storage unit in each pixel is connected to a photodiode via the transfer transistor.

SUMMARY

One non-limiting and exemplary embodiment provides an imaging device capable of realizing global shutter functions while suppressing circuit complexity within pixels.

In one general aspect, the techniques disclosed here feature an imaging device including: unit pixel cells each including a first electrode, a second electrode facing the first electrode, a photoelectric conversion layer between the first electrode and second electrode, a charge accumulation region electrically connected to the first electrode, and a signal detection circuit electrically connected to the charge accumulation region; and a voltage supply circuit electrically connected to the second electrode, the voltage supply circuit supplying a first voltage to the second electrode in a first period, the voltage supply circuit supplying a second voltage that is different from the first voltage to the second electrode in a second period different from the first period. The unit pixel cells each include a reset transistor that is electrically connected to the charge accumulation region, the reset transistor switching between supply and cutoff of a reset voltage for initializing the charge accumulation region, and a potential difference between the first electrode and the second electrode when the reset voltage is supplied is greater than a potential difference between the first electrode and the second electrode after the reset voltage is cut off.

General or specific embodiments may be implemented as an element, a device, an apparatus, a system, an integrated circuit, a method, or a computer program. General or specific embodiments may also be implemented as any selective combination of an element, a device, an apparatus, a system, an integrated circuit, a method, and a computer program.

According to an aspect of the present disclosure, an imaging device capable of realizing global shutter functions can be realized while suppressing circuit complexity within pixels.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
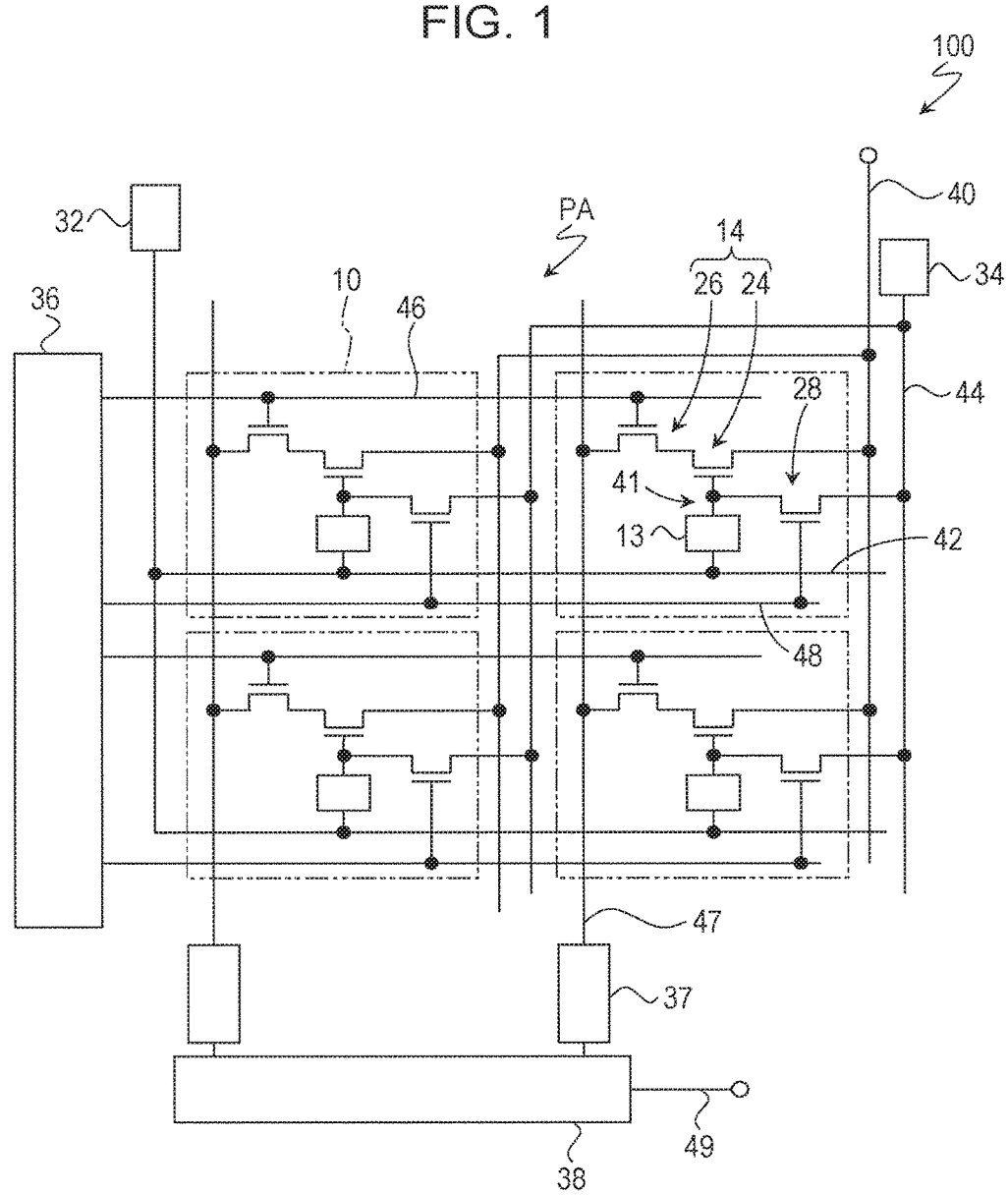
FIG. 1 is a schematic diagram illustrating an exemplary circuit configuration of an imaging device according to an embodiment of the present disclosure.

The following is an overview of an aspect of the present disclosure.

Item 1

An imaging device includes: unit pixel cells each including a first electrode, a second electrode facing the first electrode, a photoelectric conversion layer between the first electrode and second electrode, a charge accumulation region electrically connected to the first electrode, and a signal detection circuit electrically connected to the charge accumulation region; and a voltage supply circuit electrically connected to the second electrode, the voltage supply circuit supplying a first voltage to the second electrode in an exposure period that is a period for accumulating charges generated by photoelectric conversion in the charge accumulation region, the voltage supply circuit supplying a second voltage that is different from the first voltage to the second electrode in a non-exposure period. The start and end of the exposure period is common to the unit pixel cells.

Item 2

The imaging device according to Item 1, wherein the unit pixel cells each include a reset transistor that is electrically connected to the charge accumulation region, the reset transistor switching between supply and cutoff of reset voltage for initializing the charge accumulation region, and a potential difference between the first electrode and the second electrode when the reset voltage is supplied is greater than a potential difference between the first electrode and the second electrode after the reset voltage is cut off.

Item 3

The imaging device according to Item 2, wherein the reset transistor is an n-channel field-effect transistor, and the reset voltage is greater than the second voltage.

Item 4

The imaging device according to Item 2, wherein the reset transistor is a p-channel field-effect transistor, and the reset voltage is smaller than the second voltage.

Item 5

The imaging device according to any one of Items 1 through 4, wherein the unit pixel cells are two-dimensionally arrayed in rows and columns, and signals detected by the signal detection circuits of the unit pixel cells are read out at different timings for each of the rows.

Item 6

The imaging device according to any one of Items 1 through 5, wherein the exposure period is one of a plurality of exposure periods, and the plurality of the exposure periods are included in one frame period.

Item 7

The imaging device according to Item 6, wherein the voltage supply circuit supplies the first voltage to the second electrode at mutually different magnitudes among the plurality of exposure periods.

Item 8

The imaging device according to either Item 6 or 7 further includes an image forming circuit that acquires a plurality of sets of image data based on each output from the signal detection circuit at the plurality of exposure periods, and forms a multiple-exposure image by superimposing the plurality of sets of image data.

Item 9

The imaging device according to either Item 6 or 7, further includes an image forming circuit that acquires a signal from the signal detection circuit, the signal corresponding to signal charges accumulated in the charge accumulation region in the one frame period, the image forming circuit forming a multiple-exposure image based on the signal.

Item 10

The imaging device according to any one of Items 1 through 9, wherein the photoelectric conversion layer has a photocurrent characteristic between a bias voltage applied to the photoelectric conversion layer and a current density of a current flowing through the photoelectric conversion layer, the photocurrent characteristic including a first voltage range where an absolute value of the current density increases as the bias voltage increases in a reverse direction, a second voltage range where the current density increases as the bias voltage increases in a forward direction, and a third voltage range where an absolute value of a rate of change of the current density relative to the bias voltage is less than in the first voltage range and the second voltage range, the third voltage range being between the first voltage range and the second voltage range, and the voltage supply circuit supplies the second voltage to the second electrode in the non-exposure period such that the bias voltage applied to the photoelectric conversion layer falls within the third voltage range.

Item 11

An imaging device includes:

a plurality of unit pixel cells each including a first electrode, a charge accumulation region electrically connected to the first electrode, and a signal detection circuit electrically connected to the charge accumulation region;

a second electrode facing the first electrode;

a photoelectric conversion layer disposed between the first electrode and the second electrode; and a voltage supply circuit that is connected with the second electrode, and that supplies mutually different voltages to the second electrode between an exposure period and a non-exposure period, wherein the photoelectric conversion layer has photocurrent characteristics in which change in rate of output current density as to bias voltage mutually differs in a first voltage range where an absolute value of output current density increases along with increase in reverse bias voltage, a second voltage range where an absolute value of output current density increases along with increase in forward bias voltage, and a third voltage range between the first voltage range and the second voltage range, a rate of change in the third voltage range is smaller than the rate of change in the first voltage range and the second voltage range, the start and end of the exposure period is held in common among the plurality of unit pixel cells, and the voltage supply circuit supplies a voltage to the second electrode in the non-exposure period, so as to impart a potential difference between the second electrode and the signal detection circuit that falls within the third voltage range.

According to the configuration in Item 11, a global shutter can be realized without providing a separate transfer transistor and so forth within the unit pixel cell.

Item 12

The imaging device according to Item 11, wherein a plurality of the exposure periods are included in one frame period.

Item 13

The imaging device according to Item 12, wherein the voltage supply circuit supplies voltage to the second electrode at mutually different magnitudes among the plurality of exposure periods.

According to the configuration in Item 13, imaging where sensitivity is changed in each of the plurality of exposure periods can be performed.

Item 14

The imaging device according to either Item 12 or 13, further including an image forming circuit that acquires a plurality of sets of image data based on each output from the signal detection circuits at the plurality of exposure periods, and forms a multiple-exposure image by superimposing the plurality of sets of image data.

According to the configuration in Item 14, the path of an object moving over the period of one frame can be known from the multiple-exposure image.

Item 15

The imaging device according to either Item 12 or 13, further including an image forming circuit that acquires signals from the signal detection circuit, corresponding to signal charges accumulated in the charge accumulation region in the one frame period, and forms a multiple-exposure image based on the signals.

According to the configuration in Item 15, the path of an object moving over the period of one frame can be known from the multiple-exposure image.

Item 16

The imaging device according to any one of Items 11 through 15, wherein each of the unit pixel cells includes a reset transistor that is electrically connected to the charge accumulation region, and that switches supply and cutoff of reset voltage to charge accumulation region, the reset transistor is an n-channel field-effect transistor, and the reset voltage is greater than voltage that the voltage supply circuit applies to the second electrode in a non-exposure period.

According to the configuration in Item 16, parasitic sensitivity can be suppressed more effectively.

Item 17

The imaging device according to any one of Items 11 through 15, wherein each of the unit pixel cells includes a reset transistor that is electrically connected to the charge accumulation region, and that switches supply and cutoff of reset voltage to charge accumulation region, the reset transistor is a p-channel field-effect transistor, and the reset voltage is smaller than voltage that the voltage supply circuit applies to the second electrode in a second period.

According to the configuration in Item 17, parasitic sensitivity can be suppressed more effectively.

Item 18

The imaging device according to either Item 16 or 17, wherein the absolute value of difference between the reset voltage and the voltage that the voltage supply current applies to the second electrode in a non-exposure period is smaller than the breakdown voltage of the photoelectric conversion layer.

According to the configuration in Item 18, damage to the photoelectric conversion layer due to excessive application of voltage can be avoided.

Item 19

The imaging device according to either Item 16 or 17, wherein the absolute value of difference between the reset voltage and the voltage that the voltage supply current applies to the second electrode in a non-exposure period is smaller than the input voltage to the signal detection circuit.

According to the configuration in Item 19, damage to the photoelectric conversion layer due to excessive application of voltage can be avoided.

Embodiments of the present disclosure will be described below with reference to the drawings. Note that the embodiments described below are each general or specific examples. Values, shapes, materials, components, placements and connected states of components, steps, and the order of steps, and so forth illustrated in the following embodiments, are only exemplary, and do not restrict the present disclosure. Various aspects described in the present specification can be combined as long as there is no contradiction. Components in the following embodiments which are not included in an independent Claim indicating the highest concept are described as being optional components. Components having substantially the same functions may be denoted by common reference symbols in the following description, and description thereof omitted.

Embodiment of Imaging Device

FIG. 1 illustrates an exemplary circuit configuration of an imaging device according to an embodiment of the present disclosure. An imaging device 100 illustrated in FIG. 1 has a pixel array PA that includes multiple unit pixel cells 10 arrayed two-dimensionally. FIG. 1 schematically illustrates an example where unit pixel cells 10 are arrayed in a matrix of two rows by two columns. It is needless to say that the number and layout of the unit pixel cells 10 in the imaging device 100 are not restricted to the example illustrated in FIG. 1.

A unit pixel cell 10 has a photoelectric conversion unit 13 and a signal detection circuit 14. The photoelectric conversion unit 13 has a photoelectric conversion layer interposed between two mutually facing electrodes, and generates signals upon receiving incident light. The entire photoelectric conversion unit 13 does not need to be an independent element for each unit pixel cell 10, and part of a photoelectric conversion unit 13, for example, may span multiple unit pixel cells 10. The signal detection circuit 14 is a circuit that detects signals generated by the photoelectric conversion unit 13. In this example, the signal detection circuit 14 includes a signal detection transistor 24 and an address transistor 26. The signal detection transistor 24 and address transistor 26 typically are field-effect transistors (FET). The signal detection transistor 24 and address transistor 26 here are exemplified as N-channel metal-oxide semiconductor (MOS) transistors.

The control terminal (gate here) of the signal detection transistor 24 has an electrical connection with the photoelectric conversion unit 13, as schematically illustrated in FIG. 1. Signal charges (holes or electrons) generated by the photoelectric conversion unit 13 are accumulated in a charge accumulation node (also referred to as "floating diffusion node") 41 between the signal detection transistor 24 and the photoelectric conversion unit 13. Details of the photoelectric conversion unit 13 will be described later.

The photoelectric conversion unit 13 of the unit pixel cell 10 further has a connection with a sensitivity control line 42. The sensitivity control line 42 is connected to a sensitivity control voltage supply circuit 32 (hereinafter referred to simply as "voltage supply circuit 32") in the configuration exemplified in FIG. 1. This voltage supply circuit 32 is a circuit configured to be capable of supplying at least two types of voltage. The voltage supply circuit 32 supplies predetermined voltage to the photoelectric conversion unit 13 via the sensitivity control line 42 when the imaging device 100 is operating. The voltage supply circuit 32 is not restricted to a particular power source circuit, and may be a circuit that generates a predetermined voltage, or may be a circuit that converts voltage supplied from another power source into predetermined voltage. Starting and ending of accumulation of signal charges from the photoelectric conversion unit 13 to the charge accumulation node 41 is controlled by the voltage supplied from the voltage supply circuit 32 to the photoelectric conversion unit 13 being switched among multiple voltages that are different from each other, which will be described later in detail. In other words, electronic shutter operations are executed in the embodiment according to the present disclosure by switching voltage supplied from the voltage supply circuit 32 to the photoelectric conversion unit 13. An example of operations of the imaging device 100 will be described later.

Each unit pixel cell 10 has a connection with a power source line 40 that supplies power source voltage VDD. The input terminal (typically the drain) of the signal detection transistor 24 is connected to the power source line 40, as illustrated in FIG. 1. The signal detection transistor 24 amplifies and outputs signals generated by the photoelectric conversion unit 13 due to the power source line 40 functioning as a source-follower power source.

The output terminal (source here) of the signal detection transistor 24 is connected to the input terminal (drain here) of the address transistor 26. The output terminal (source here) of the address transistor 26 is connected to one of multiple vertical signal lines 47 arranged in each pixel array PA row. The control terminal (gate here) of the address transistor 26 is connected to an address control line 46, and the output of the signal detection transistor 24 can be selectively read out to the corresponding vertical signal line 47 by controlling the potential of the address control line 46.

In the example illustrated in FIG. 1, the address control line 46 is connected to a vertical scan circuit (also referred to as "row scan circuit") 36. The vertical scan circuit 36 selects multiple unit pixel cells 10 arranged in each row by applying a predetermined voltage to the address control line 46. This executes readout of signals in the selected unit pixel cells 10, and later-described resetting of pixel electrodes.

The vertical signal line 47 is a primary signal line transmitting pixel signals from the pixel array PA to peripheral circuits. A column signal processing circuit (also referred to as "row signal accumulation circuit") 37 is connected to the vertical signal line 47. The column signal processing circuit 37 performs noise suppression signal processing, of which correlated double sampling is representative, analog-to-digital conversion (AD conversion), and so forth. A column signal processing circuit 37 is provided corresponding to each column of unit pixel cells 10 in the pixel array PA, as illustrated in FIG. 1. Connected to these column signal processing circuits 37 are a horizontal signal read circuit (also referred to as "column scan circuit") 38. The horizontal signal read circuit 38 sequentially reads out signals from the column signal processing circuits 37 to a horizontal common signal line 49.

In the configuration exemplified in FIG. 1, the unit pixel cell 10 has a reset transistor 28. The reset transistor 28 may be a field-effect transistor, in the same way as the signal detection transistor 24 and address transistor 26, for example. An example will be described below where an N-channel MOS is applied as the reset transistor 28, unless specifically stated otherwise. As illustrated in FIG. 1, the reset transistor 28 is connected between a reset voltage line 44 that supplies reset voltage Vr and a charge accumulation node 41. The control terminal (gate here) of the reset transistor 28 is connected to a reset control line 48, and the potential of the charge accumulation node 41 can be reset to the reset voltage Vr by controlling the potential of the reset control line 48. The reset control line 48 is connected to the vertical scan circuit 36 is this example. Accordingly, multiple unit pixel cells 10 arrayed in each row can be reset in increments of rows by the vertical scan circuit 36 applying predetermined voltage to the reset control line 48.

In this example, the reset voltage line 44 that supplies reset voltage Vr to the reset transistor 28 is connected to the reset voltage supply circuit 34. It is sufficient that the configuration of the reset voltage source 34 enables a predetermined reset voltage Vr to be supplied to the reset voltage line 44 when the imaging device 100 is operating, and is not restricted to any particular power source circuit, the same as with the voltage supply circuit 32 described above. The voltage supply circuit 32 and reset voltage source 34 may each be part of a single voltage supply circuit, or may be independent and separate voltage supply circuits. Note that one or both of the voltage supply circuit 32 and reset voltage source 34 may be part of the vertical scan circuit 36. Alternatively, sensitivity control voltage from the voltage supply circuit 32 and/or reset voltage Vr from the reset voltage source 34 may be supplied to each unit pixel cell 10 via the vertical scan circuit 36.

Power source voltage VDD of the signal detection circuit 14 may be used as the reset voltage Vr. In this case, a voltage supply circuit that supplies power source voltage to each of the unit pixel cells 10 (omitted from illustration in FIG. 1) and the reset voltage source 34 may be commonalized. The power source line 40 and reset voltage line 44 can also be commonalized, so the wiring of the pixel array PA can be simplified. Note however, that using mutually different voltages for the reset voltage Vr and for the power source voltage VDD of the signal detection circuit 14 enables more flexible control of the imaging device 100.

Device Structure of Unit Pixel Cell

Figure 2:
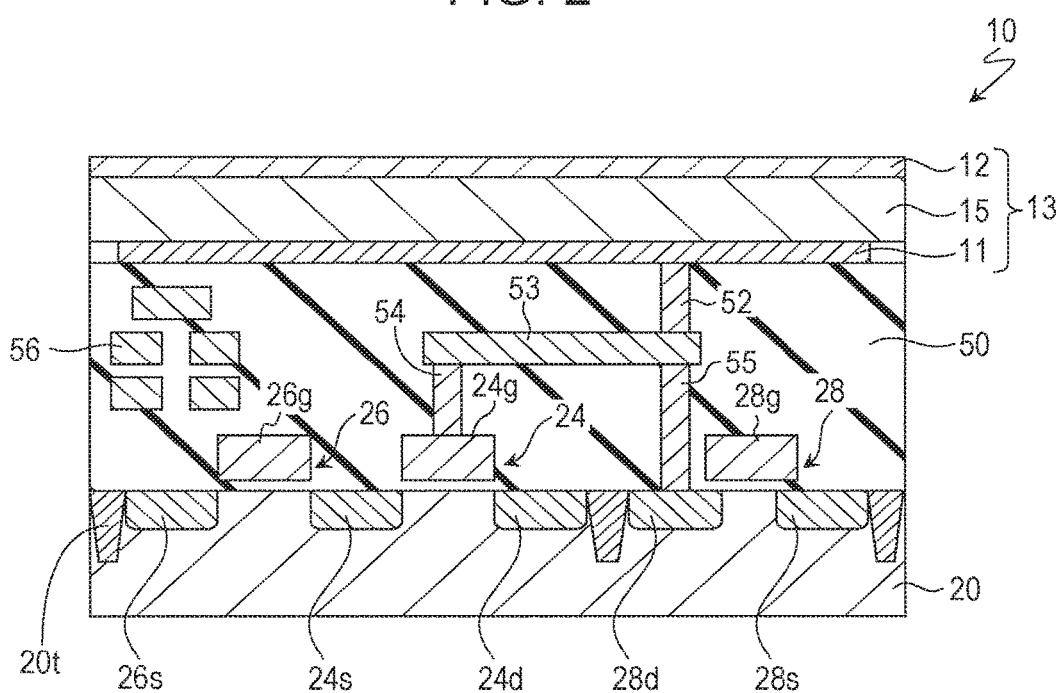
FIG. 2 is a schematic cross-sectional view illustrating an exemplary device structure of a unit pixel cell.

FIG. 2 schematically illustrates an exemplary device structure of the unit pixel cell 10. The above-described signal detection transistor 24, address transistor 26, and reset transistor 28, are formed on a semiconductor substrate 20 in the configuration exemplified in FIG. 2. The semiconductor substrate 20 is not restricted to a substrate of which the entirety is a semiconductor. The semiconductor substrate 20 may be an insulating substrate, where a semiconductor layer has been formed on the surface of a side where a photosensitive region is formed, or the like. An example of using a P-type silicon (Si) substrate as the semiconductor substrate 20 will be described here.

The semiconductor substrate 20 includes impurity regions (N-type region here) 26s, 24s, 24d, 28d, and 28s, and element separation region 20t for electric separation among unit pixel cells 10. The element separation region 20t is also provided between impurity region 24d and impurity region 28d as well. The element separation region 20t is formed by injecting acceptor ions under predetermined injection conditions, for example.

The impurity regions (N-type region here) 26s, 24s, 24d, 28d, and 28s, typically are diffusion layers formed within the semiconductor substrate 20. The signal detection transistor 24 includes the impurity regions 24s and 24d, and gate electrode 24g (typically a polysilicon electrode), as schematically illustrated in FIG. 2. The impurity region 24s functions as a source region, for example, of the signal detection transistor 24. The impurity region 24*d* functions as a drain region, for example, of the signal detection transistor 24. A channel region of the signal detection transistor 24 is formed between the impurity regions 24*s* and 24*d*.

In the same way, the address transistor 26 includes the impurity regions 26*s* and 24*s*, and a gate electrode 26*g* (typically a polysilicon electrode) connected to the address control line 46 (see FIG. 1). In this example, the signal detection transistor 24 and address transistor 26 are electrically connected to each other by sharing the impurity region 24*s*. The impurity region 26*s* functions as a source region, for example, of the address transistor 26. The impurity region 26*s* has a connection with the vertical signal line 47 (see FIG. 1) that is omitted from FIG. 2.

The reset transistor 28 has impurity regions 28*d* and 28*s*, and a gate electrode 28*g* (typically a polysilicon electrode) connected to the reset control line 48 (see FIG. 1). The impurity region 28*s* functions as a source region, for example, of the reset transistor 28. The impurity region 28*s* has a connection with the reset voltage line 44 (see FIG. 1) that is omitted from FIG. 2.

An inter-layer insulation layer 50 (typically a silicon dioxide layer) is disposed on the semiconductor substrate 20, covering the signal detection transistor 24, address transistor 26, and reset transistor 28. A wiring layer 56 may be disposed in the inter-layer insulation layer 50. The wiring layer 56 typically is formed of metal such as copper or the like, and can include wiring such as the above-described vertical signal line 47 and so forth as a part thereof, for example. The number of layers of the insulating layer in the inter-layer insulation layer 50, and the number of layers of the wiring layer 56 disposed in the inter-layer insulation layer 50 may be optionally set, and are not restricted to the example illustrated in FIG. 2.

The above-described photoelectric conversion unit 13 is disposed on the inter-layer insulation layer 50. In other words, the multiple unit pixel cells 10 making up the pixel array PA (see FIG. 1) are formed on the semiconductor substrate 20 in the embodiment according to the present disclosure. The unit pixel cells 10 arrayed two-dimensionally on the semiconductor substrate 20 form a photosensitive region (pixel region). The distance between the centers of two adjacent unit pixel cells 10 (pixel pitch) may be around 2 μm, for example.

The photoelectric conversion unit 13 includes a pixel electrode 11, an opposing electrode 12, and the photoelectric conversion layer 15 interposed therebetween. The opposing electrode 12 and photoelectric conversion layer 15 are formed spanning multiple unit pixel cells 10 in this example. On the other hand, the pixel electrode 11 is formed for each unit pixel cell 10, and is electrically separated from pixel electrodes 11 of other unit pixel cells 10 by being spatially separated from pixel electrodes 11 of other unit pixel cells 10.

The opposing electrode 12 is typically a transparent electrode formed of a transparent electroconductive material. The opposing electrode 12 is disposed at the side where light enters the photoelectric conversion layer 15. Accordingly, light that has passed through the opposing electrode 12 enters the photoelectric conversion layer 15. Light detected by the imaging device 100 is not restricted to the wavelength range of visible light (e.g., 380 nm or more, and 780 nm or less). The term "transparent" as used in the present specification means that at least part of light of a wavelength range to be detected is transmitted, and transmitting the entire wavelength range of visible light is not essential. For the sake of convenience, the electromagnetic waves in general, including infrared rays and ultraviolet rays, will be expressed as "light". For example, transparent conducting oxides (TCO) such as indium tin oxide (ITO), indium zinc oxide (IZO), aluminum-doped zinc oxide (AZO), fluorine doped tin oxide (FTO), tin dioxide ($SnO_2$), titanium dioxide ($TiO_2$), zinc dioxide ($ZnO_2$), and so forth, can be used as the opposing electrode 12.

The photoelectric conversion layer 15 receives incident light, and generates hole-electron pairs. The photoelectric conversion layer 15 typically is formed of an organic material. Specific examples of materials configuring the photoelectric conversion layer 15 will be described later.

As described referring to FIG. 1, the opposing electrode 12 has a connection with the sensitivity control line 42 connected to the voltage supply circuit 32. The opposing electrode 12 here is formed spanning multiple unit pixel cells 10. Accordingly, sensitivity control voltage of a predetermined magnitude can be applied en bloc from the voltage supply circuit 32 to the unit pixel cells 10 via the sensitivity control line 42. Note that the opposing electrode 12 may be separated for each unit pixel cell 10, as long as sensitivity control voltage of a predetermined magnitude can be applied from the voltage supply circuit 32. In the same way, the photoelectric conversion layer 15 may be separated for each unit pixel cell 10.

The voltage supply circuit 32 supplies mutually different voltages to the opposing electrode 12, depending on whether during an exposure period or a non-exposure period, which will be described later in detail. The term "exposure period" in the present specification means a period for accumulating one of positive and negative charges (signal charges) generated by photoelectric conversion in the charge accumulation region, and may be referred to as "charge accumulation period". A period during operations of the imaging device other than an exposure period is referred to as "non-exposure period" in the present specification. Note that "non-exposure period" is not restricted to a period when input of light to the photoelectric conversion unit 13 is shielded, and may include a period when the photoelectric conversion unit 13 is being irradiated by light. "Non-exposure period" also includes a period when signal charges are unintentionally accumulated in the charge accumulation region due to occurrence of parasitic sensitivity.

Controlling the potential of the opposing electrode 12 relative to the potential of the pixel electrode 11 enables one of holes and electrons, of the hole-electron pairs generated in the photoelectric conversion layer 15 by photoelectric conversion, to be collected by the pixel electrode 11. For example, in a case of using holes as signal charges, holes can be selectively collected by the pixel electrode 11 by setting the potential of the opposing electrode 12 higher than the potential of the pixel electrode 11. A case of using holes as signal charges will be exemplified below. Of course, electrons can be used as signals charges as well.

Applying an appropriate bias voltage between the opposing electrode 12 and pixel electrode 11 causes the pixel electrode 11 facing the opposing electrode 12 to collect one of positive and negative charges generated by photoelectric conversion at the photoelectric conversion layer 15. The pixel electrode 11 is formed of a metal such as aluminum, copper, or the like, a metal nitride, polysilicon that has been imparted electroconductivity by doping with an impurity, or the like.

The pixel electrode 11 may be a light-shielding electrode. For example, forming a tantalum nitride (TaN) electrode 100 nm thick as the pixel electrode 11 realizes sufficient light shielding characteristics. Forming the pixel electrode 11 as a light-shielding electrode enables light that has passed through the photoelectric conversion layer 15 to be suppressed from entering the channel region or impurity region of transistors (at least one of the signal detection transistor 24, address transistor 26, and reset transistor 28 in this example) formed on the semiconductor substrate 20. The above-described wiring layer 56 may be used to form a light-shielding layer in the inter-layer insulation layer 50. Suppressing light from entering the channel region of transistors formed on the semiconductor substrate 20 enables shifting of transistor characteristics (e.g., change in threshold voltage) and so forth to be suppressed. Suppressing light from entering the impurity region formed on the semiconductor substrate 20 enables unintended noise due to photoelectric conversion in the impurity region from being included. Thus, suppressing light from entering the semiconductor substrate 20 contributes to improved reliability of the imaging device 100.

The pixel electrode 11 is connected to the gate electrode 24g of the signal detection transistor 24 via a plug 52, wiring 53, and a contact plug 54, as schematically illustrated in FIG. 2. In other words, the gate of the signal detection transistor 24 has electric connection with the pixel electrode 11. The plug 52 and wiring 53 are formed of metal such as copper, for example. The plug 52, wiring 53, and contact plug 54 make up at least part of the charge accumulation node 41 (see FIG. 1) between the signal detection transistor 24 and the photoelectric conversion unit 13. The wiring 53 may be part of the wiring layer 56. The pixel electrode 11 is also connected to the impurity region 28d via the plug 52, wiring 53, and a contact plug 55. In the configuration illustrated in FIG. 2, the gate electrode 24g of the signal detection transistor 24, the plug 52, wiring 53, contact plugs 54 and 55, and the impurity region 28d that is one of the source region and drain region of the reset transistor 28, function as the charge accumulation region accumulating signal charges collected by the pixel electrode 11.

By collecting signal charges to the pixel electrode 11, voltage corresponding to the quantity of signal charges accumulated in the charge accumulation region is applied to the gate of the signal detection transistor 24. The signal detection transistor 24 amplifies this voltage. The voltage amplified by the signal detection transistor 24 is selectively read out via the address transistor 26 as signal voltage.

Findings of Present Inventors and Typical Example of Configuration of Photoelectric Conversion Layer As described above, irradiating the photoelectric conversion layer 15 by light and applying bias voltage between the pixel electrode 11 and opposing electrode 12 enables one of positive and negative charges generated by photoelectric conversion to be collected by the pixel electrode 11, and the collected charges to be accumulated in the charge accumulation region. The present inventors have found that movement of signal charges already accumulated in the charge accumulation region to the opposing electrode 12 via the photoelectric conversion layer 15 can be suppressed by using a photoelectric conversion layer 15, having photocurrent characteristics such as described below, in the photoelectric conversion unit 13 and reducing the potential difference between the pixel electrode 11 and opposing electrode 12 to a certain level. The present inventors have further found that further accumulation of signal charges in the charge accumulation region can be suppressed after reducing the potential difference. That is to say, it has been found that global shutter functions can be realized by controlling the magnitude of bias voltage applied to the photoelectric conversion layer 15, without separately providing elements such as a transfer transistor to each of the multiple pixels. A typical example of operations at the imaging device 100 will be described later.

An example of the configuration of the photoelectric conversion layer 15, and photocurrent characteristics of the photoelectric conversion layer 15, will be described below. The photoelectric conversion layer 15 typically contains a semiconductor material. An organic semiconductor material is used here as the semiconductor material. The photoelectric conversion layer 15 includes tin naphthalocyanine expressed by the general formula (1) below (hereinafter may be referred to simply as "tin naphthalocyanine").

General Formula (1)

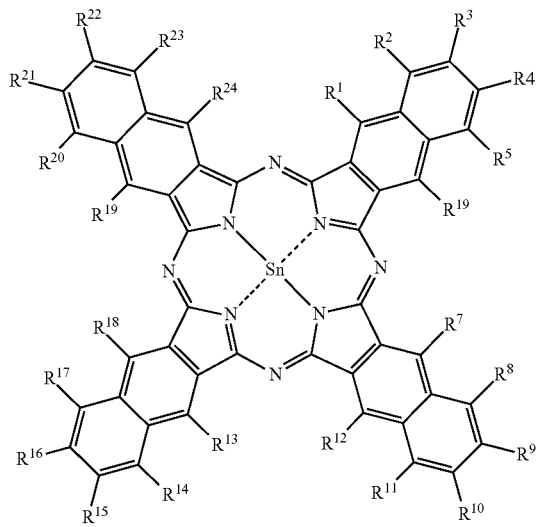

(1)

In the general formula (1), $R^1$ through $R^{24}$ independently represent a hydrogen atom or substituent group. Substituent groups are not restricted to particular substituent groups. A substituent group may be a deuterium atom, halogen atom, alkylic group (including cycloalkyl group, bicycloalkyl group, tricycloalkyl group), alkenyl group (including cycloalkenyl group and bicycloalkenyl group), alkynyl group, aryl group, heterocyclic group (may also be called hetero ring group), cyano group, hydroxy group, nitro group, carboxy group, alkoxy group, aryloxy group, silyloxy group, heterocyclic oxy group, acyloxy group, carbamoyloxy group, alkoxycarbonyloxy group, aryloxycarbonyloxy group, amino group (including anilino group), ammonio group, acylamino group, aminocarbonyl amino group, alkoxycarbonylamino group, aryloxy carbonylamino group, sulfamoyl amino group, alkylsulfonyl amino group, arylsulfonylamino group, mercapto group, alkylthio group, arylthio group, heterocyclic thio group, sulfamoyl group, sulfo group, alkylsulfinyl group, arylsulfinyl group, alkylsulfonyl group, arylsulfonyl group, acyl group, aryloxycarbonyl group, alkoxycarbonyl group, carbamoyl group, arylazo group, heterocyclic azo group, imide group, phosphino group, phosphinyl group, phosphinyloxy group, hophinyl amino group, phosphono group, silyl group, hydrazino group, ureido group, boronic acid group (—B(OH)$_2$), phosphato group (—OPO(OH)$_2$), sulfato group (—OSO$_3$H), or other known substituent groups.

Commercially-available products can be used for the tin naphthalocyanine in the above-described general formula (1). Alternatively, the tin naphthalocyanine in the above-described general formula (1) may be synthesized using a naphthalene derivative shown in the following general formula (2) as the starting material, as described in Japanese Unexamined Patent Application Publication No. 2010-232410. $R^{25}$ through $R^{30}$ in general formula (2) may be substituents the same as $R^1$ through $R^{24}$ in general formula (1).

General Formula (2)

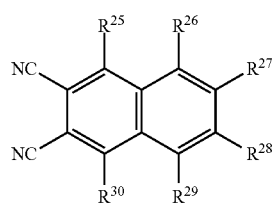

(2)

From the perspective of ease of controlling the coagulation state of molecules, it is desirable that in the tin naphthalocyanine in the above-described general formula (1), eight or more of the $R^1$ through $R^{24}$ are hydrogen atoms or deuterium atoms, more desirable that 16 or more of the $R^1$ through $R^{24}$ are hydrogen atoms or deuterium atoms, and even more desirable that all of the $R^1$ through $R^{24}$ are hydrogen atoms or deuterium atoms. Further, the tin naphthalocyanine shown in the following general formula (3) is advantageous from the perspective of ease of synthesis.

General Formula (3)

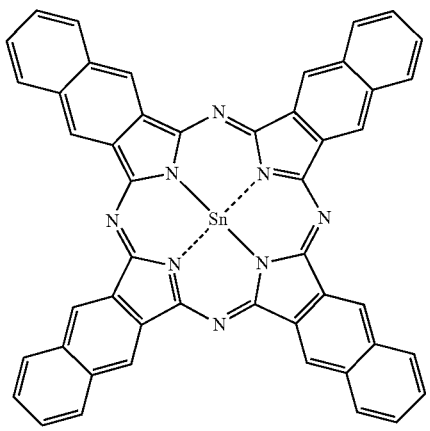

(3)

Figure 3:
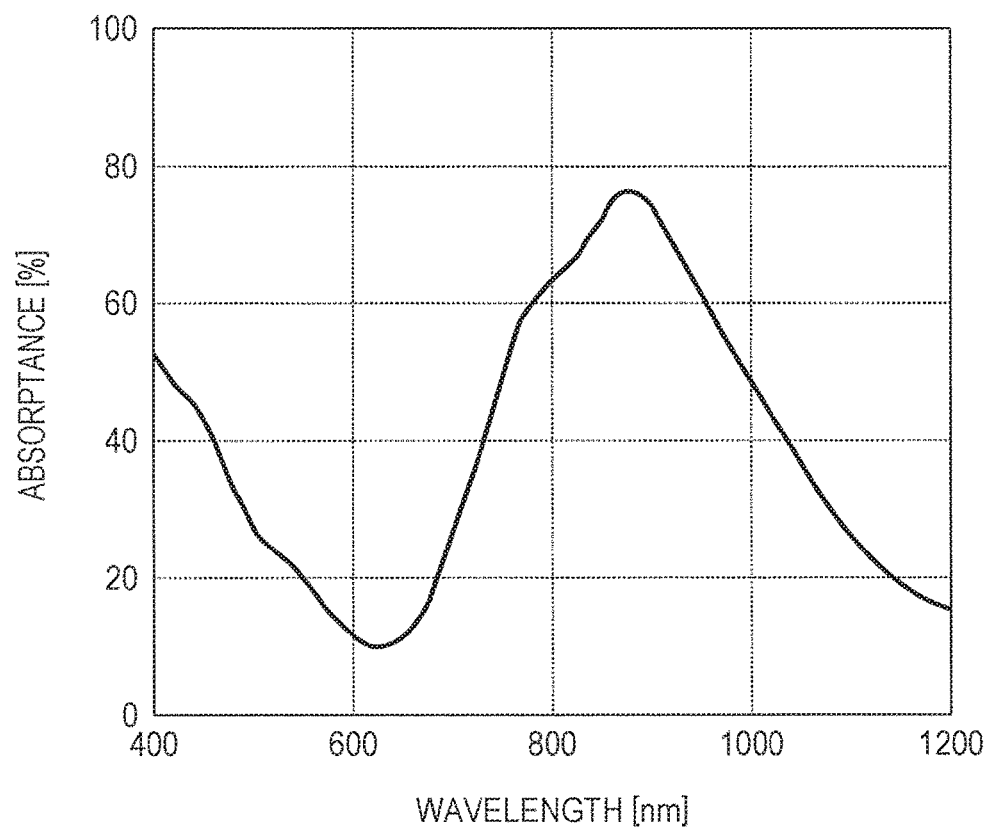
FIG. 3 is a diagram illustrating an example of an absorption spectrum in a photoelectric conversion layer containing tin naphthalocyanine.

The tin naphthalocyanine in the above-described general formula (1) has absorption in a wavelength band generally 200 nm or more and 1100 nm or less. For example, the tin naphthalocyanine in the general formula (3) has an absorption peak at a position around a wavelength of 870 nm, as illustrated in FIG. 3. FIG. 3 is an example of an absorption spectrum in a photoelectric conversion layer containing the tin naphthalocyanine shown in the general formula (3). Note that measurement of the absorption spectrum as performed using a sample where a photoelectric conversion layer (30 nm thick) was deposited on a quartz substrate.

It can be seen from FIG. 3 that a photoelectric conversion layer formed of material including tin naphthalocyanine has absorption in a near-infrared region. That is to say, selecting a material including tin naphthalocyanine as the material for configuring the photoelectric conversion layer 15 enables a light sensor that can detect near-infrared rays to be realized, for example.

Figure 4:
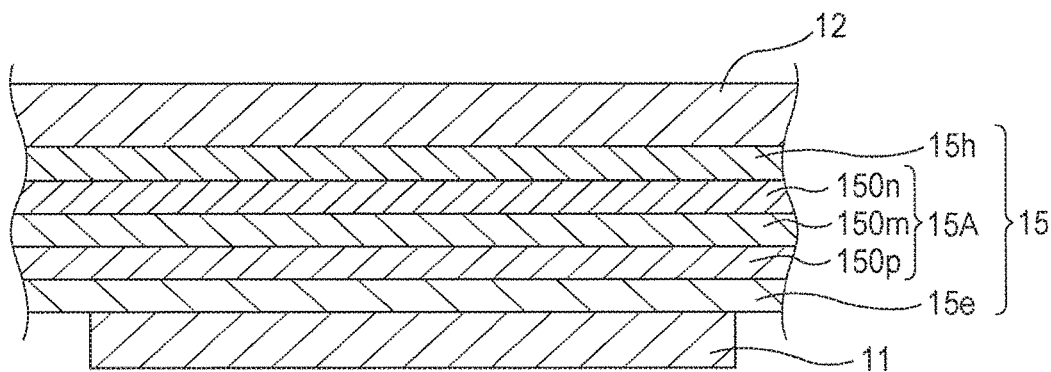
FIG. 4 is a schematic cross-sectional view illustrating an example of the configuration of a photoelectric conversion layer.

FIG. 4 schematically illustrates an example of the configuration of the photoelectric conversion layer 15. In the configuration exemplarily illustrated in FIG. 4, the photoelectric conversion layer 15 includes a hole blocking layer 15*h*, a photoelectric conversion structure 15A formed using an organic semiconductor material including the tin naphthalocyanine in the above-described general formula (1), and an electron blocking layer 15*e*. The hole blocking layer 15*h* is disposed between the photoelectric conversion structure 15A and opposing electrode 12, and the electron blocking layer 15*e* is disposed between the photoelectric conversion structure 15A and pixel electrode 11.

The photoelectric conversion structure 15A illustrated in FIG. 4 includes at least one of a p-type semiconductor and n-type semiconductor. In the configuration exemplarily illustrated in FIG. 4, the photoelectric conversion structure 15A includes a p-type semiconductor layer 150*p*, an n-type semiconductor layer 150*n*, and a mixed layer 150*m* interposed between the p-type semiconductor layer 150*p* and n-type semiconductor layer 150*n*. The p-type semiconductor layer 150*p* is disposed between the electron blocking layer 15*e* and the mixed layer 150*m*, and has photoelectric conversion and/or hole transporting functions. The n-type semiconductor layer 150*n* is disposed been the hole blocking layer 15*h* and the mixed layer 150*m*, and has photoelectric conversion and/or electron transporting functions. The mixed layer 150*m* may contain at least one of a p-type semiconductor and an n-type semiconductor, which will be described later.

The p-type semiconductor layer 150*p* and the n-type semiconductor layer 150*n* respectively include an organic p-type semiconductor and an organic n-type semiconductor. That is to say, the photoelectric conversion structure 15A includes an organic photoelectric conversion material including the tin naphthalocyanine in the above-described general formula (1), and at least one of an organic p-type semiconductor and an organic n-type semiconductor.

The organic p-type semiconductor (compound) is a donor organic semiconductor (compound) and is an organic compound that is primarily represented by hole-transporting organic compounds and has a nature of readily donating electrons. More specifically, the organic p-type semiconductor (compound) is an organic compound that has the smaller ionization potential of two organic materials when the two organic materials are used in contact. Accordingly, any organic compound can be used as the donor organic compound as long as it is an electron-donating organic compound. Examples include a triarylamine compound, benzidine compound, pyrazoline compound, styrylamine compound, hydrazone compound, triphenylmethane compound, carbazole compound, polysilane compound, thiophene compound, phthalocyanine compound, cyanine compound, merocyanine compound, oxonol compound, polyamine compound, indole compound, pyrrole compound, pyrazole compound, polyarylene compound, condensed aromatic carbocyclic compound (naphthalene derivative, anthracene derivative, phenanthrene derivative, tetracene derivative, pyrene derivative, perylene derivative, fluoranthene derivative), metallic complex having a nitrogen-containing heterocyclic compound as a ligand, and so forth. Note that donor organic semiconductors are not restricted to those, and any organic compound can be used as the donor organic semiconductors as long as it has an ionization potential smaller than an organic compound used as an n-type (acceptor) compound. The above-described tin naphthalocyanine is an example of an organic p-type semiconductor material.

The organic n-type semiconductor (compound) is an acceptor organic semiconductor (compound) and is an organic compound that is primarily represented by electron-transporting organic compounds and has a nature of readily accepting electrons. More specifically, the organic n-type semiconductor (compound) is an organic compound that has the greater electron affinity of two organic materials when the two organic materials are used in contact. Accordingly, any organic compound can be used as the acceptor organic compound as long as it is an electron-accepting organic compound. Examples include fullerene, fullerene derivative, condensed aromatic carbocyclic compound (naphthalene derivative, anthracene derivative, phenanthrene derivative, tetracene derivative, pyrene derivative, perylene derivative, fluoranthene derivative), five- to seven-membered heterocyclic compounds including nitrogen atoms, oxygen atoms, or sulfur atoms (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, piridine, pyrrolopyridine, thiadiazolopyridine, dibenzazepine, tribenzazepine, etc.), polyarylene compound, fluorene compound, cyclopentadiene compound, silyl compound, metallic complex having a nitrogen-containing heterocyclic compound as a ligand, and so forth. Note that acceptor organic semiconductors are not restricted to those, and any organic compound can be used as the acceptor organic semiconductor as long as it has an electron affinity greater than an organic compound used as a p-type (donor) compound.

The mixed layer 150m may be a bulk heterojunction structure including a p-type semiconductor and an n-type semiconductor, for example. In a case of forming the mixed layer 150m as a layer having a bulk heterojunction structure, the tin naphthalocyanine in the above-described general formula (1) may be used as the p-type semiconductor material. Fullerene and/or a fullerene derivative, for example, may be used as the n-type semiconductor material. It is advantageous for the material making up the p-type semiconductor layer 150p to be the same as the p-type semiconductor material included in the mixed layer 150m. In the same way, it is advantageous for the material making up the n-type semiconductor layer 150n to be the same as the n-type semiconductor material included in the mixed layer 150m. A bulk heterojunction structure is disclosed in Japanese Patent No. 5553727. The contents of the disclosure in Japanese Patent No. 5553727 are hereby incorporated in the present specification for reference.

Using an appropriate material in accordance with the wavelength band regarding which detection is desired enables an imaging device having sensitivity regarding the desired wavelength band to be realized. The photoelectric conversion layer 15 may include inorganic semiconductor material such as amorphous silicon and the like. The photoelectric conversion layer 15 may include a layer made up of organic material and a layer made up of inorganic material. An example of applying a bulk heterojunction structure, obtained by codeposition of tin naphthalocyanine and $C_{60}$, to the photoelectric conversion layer 15, will be described below.

Photocurrent Characteristics in Photoelectric Conversion Layer

Figure 5:
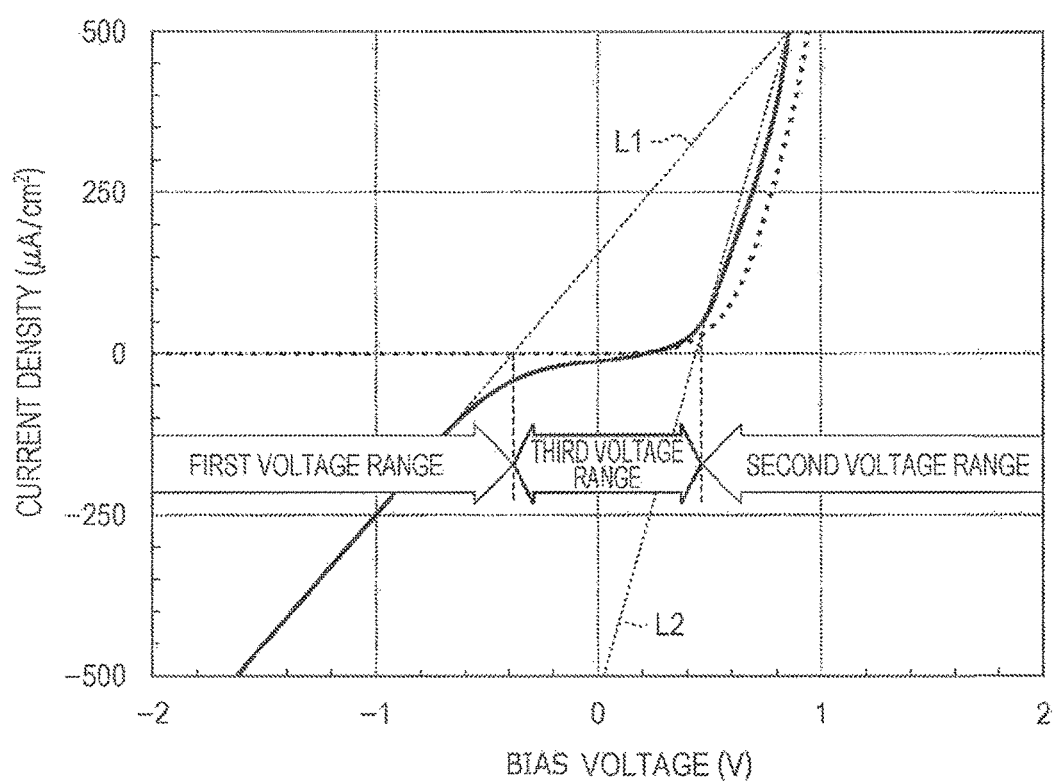
FIG. 5 is a graph illustrating typical photocurrent characteristics that the photoelectric conversion layer has.

FIG. 5 illustrates typical photocurrent characteristics of the photoelectric conversion layer 15. The graph with the thick solid line in FIG. 5 represents exemplary current-voltage characteristics (I-V characteristics) of the photoelectric conversion layer 15. Note that FIG. 5 also illustrates an example of I-V characteristics in a state where there is no irradiation by light, by the thick dotted line.

FIG. 5 illustrates change in current density between two principal faces of the photoelectric conversion layer 15 when bias voltage applied therebetween is changed. In the present specification, the forward direction and reverse direction in bias voltage is defined as follows. In a case where the photoelectric conversion layer 15 has a junction structure of a layered p-type semiconductor and a layered n-type semiconductor, bias voltage where the potential of the p-type semiconductor layer is higher than that of the n-type semiconductor layer is defined as forward bias voltage. On the other hand, bias voltage where the potential of the p-type semiconductor layer is lower than that of the n-type semiconductor layer is defined as reverse bias voltage. Forward and reverse can be defined in a case of using organic semiconductor material, in the same way as a case of using inorganic semiconductor material. In a case where the photoelectric conversion layer 15 has a bulk heterojunction structure, more p-type semiconductor than n-type semiconductor appears on one surface of the two principal faces of the bulk heterojunction structure, and more n-type semiconductor than p-type semiconductor appears on the other surface, as schematically illustrated in FIG. 1 of Japanese Patent No. 5553727 described above. Accordingly, bias voltage where the potential of the principal face where more p-type semiconductor than n-type semiconductor appears, is higher than that of the principal face where more n-type semiconductor than p-type semiconductor appears, is defined as forward bias voltage.

The photocurrent characteristics of the photoelectric conversion layer 15 are schematically characterized by three voltage ranges, which are the first through third voltage ranges illustrated in FIG. 5. The first voltage range is a reverse bias voltage range, and is a voltage range where the absolute value of output current density increases along with increase in reverse bias voltage. The first voltage range can be said to be a voltage range where photocurrent increases along with increase in bias voltage applied between the principal faces of the photoelectric conversion layer 15. The second voltage range is a forward bias voltage range, and is a voltage range where the absolute value of output current density increases along with increase in forward bias voltage. That is to say, the second voltage range is a voltage range where forward current increases along with increase in bias voltage applied between the principal faces of the photoelectric conversion layer 15. The third voltage range is a voltage range between the first voltage range and the second voltage range.

The first through third voltage ranges are distinguished by the inclination of the photocurrent characteristic graph when a linear vertical axis and a linear horizontal axis are used. For reference, the average inclinations of the graph in the first voltage range and the second voltage range are respectively indicated by a dotted line L1 and dotted line L2. The rate of change of output current density relative to increase of bias voltage differs among the first voltage range, second voltage range, and third voltage range, as exemplarily illustrated in FIG. 5. The third voltage range is defined as a voltage range where the rate of change of output current density relative to bias voltage is smaller than the rate of change in the first voltage range and the rate of change in the second voltage range. Alternatively, the third voltage range may be decided based on the position where the graph representing I-V characteristics rises (falls). The third voltage range typically is greater than −1 V and smaller than +1 V. Changing the bias voltage within the third voltage range hardly changes the current density between principal faces of the photoelectric conversion layer 15. The absolute value of current density in the third voltage range typically is 100 μmA/cm² or less.

Example of Operations of Imaging Device 100

Figure 6:
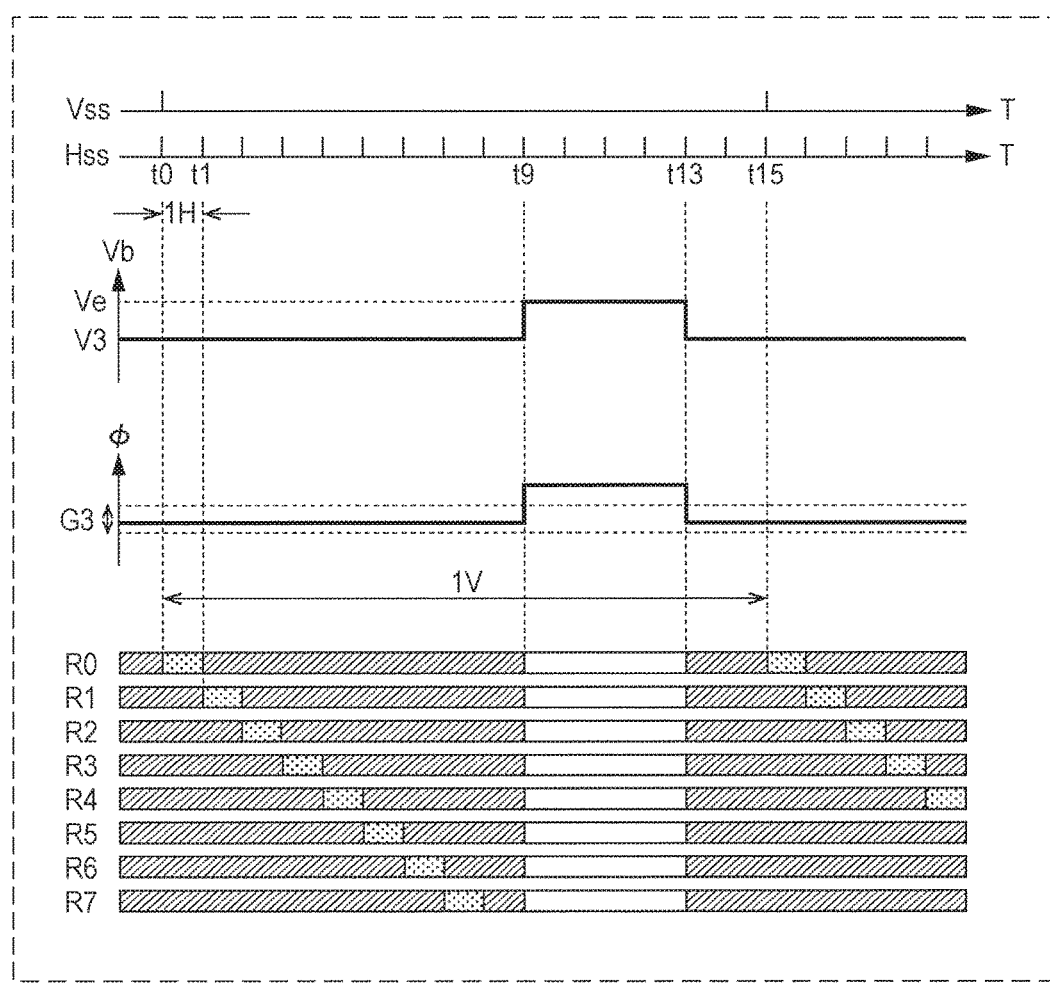
FIG. 6 is a diagram for describing an example of operations in an imaging device according to an embodiment of the present disclosure.

FIG. 6 is a diagram for describing an example of operations of the imaging device according to the embodiment of the present disclosure. FIG. 6 illustrates the timing of the trailing edge (or leading edge) of a synchronization signal, change over time of the magnitude of bias voltage applied to the photoelectric conversion layer 15, and the timing of resetting and exposure in each row of the pixel array PA (see FIG. 1). More specifically, the topmost graph in FIG. 6 indicates the timing of the trailing edge (or leading edge) of a vertical synchronization signal Vss. The second graph from the top indicates the timing of the trailing edge (or leading edge) of a horizontal synchronization signal Hss. Beneath these graphs are illustrated an example of change over time of voltage Vb applied from the voltage supply circuit 32 to the opposing electrode 12 via the sensitivity control line 42. Under the graph of change over time of voltage Vb is change over time of potential ϕ of the opposing electrode 12 with the potential of the pixel electrode 11 as a reference. The both-sided arrow G3 at the potential ϕ graph indicates the above-described third voltage range. The chart further below schematically illustrates the timing of resetting and exposure at each row in the pixel array PA.

Hereinafter, an example of operations at the imaging device 100 will be described with reference to FIGS. 1, 2, and 6. For the sake of brevity, an example of operations in a case where the number of rows of pixels included in the pixel array PA is the eight rows of row R0 through row R7.

In the acquisition of an image, first, resetting of the charge accumulation region of each unit pixel cell 10 in the pixel array PA, and pixel signal readout after resetting, is performed. For example, resetting is started of the multiple pixels belonging to the R0 row, based on the vertical synchronization signal Vss (time t0). Note that the rectangles indicated by dots in FIG. 6 schematically represent signal readout periods. These readout periods may include a reset period for resetting the potential of the charge accumulation region of the unit pixel cell 10 therein.

In the resetting of pixels belonging to the R0 row, the address transistor 26 the gate of which is connected to the address control line 46 is turned ON by control of the potential of the address control line 46 for the row R0, and further, the reset transistor 28 the gate of which is connected to the reset control line 48 is turned ON by control of the potential of the reset control line 48 for the row R0. Accordingly, the charge accumulation node 41 and reset voltage line 44 are connected to each other, and reset voltage Vr is supplied to the charge accumulation region. That is to say, the potential of the gate electrode 24g of the signal detection transistor 24 and the pixel electrode 11 of the photoelectric conversion unit 13 is reset to the reset voltage Vr. Thereafter, after resetting, pixel signals are read out from the unit pixel cells 10 in the row R0 via the vertical signal line 47. The pixel signals obtained at this time are pixel signals corresponding to the magnitude of the reset voltage Vr. After reading out of the pixel signals, the reset transistor 28 and address transistor 26 are turned off.

In this example, resetting of pixels belonging to the rows of row R0 through row R7 in accordance with the horizontal synchronization signal Hss is sequentially executed, as schematically illustrated in FIG. 6. Hereinafter, intervals between horizontal synchronization signal Hss pulses, i.e., a period from the time when one row is selected to the time when the next row is selected, may be referred to as "one H period". The period from time t0 to time t1 is equivalent to one H period in this example.

During the period from the time when image acquisition starts to the time when resetting and readout of the pixel signal of all pixel arrays PA ends (time t0 through t9), a voltage V3 is applied from the voltage supply circuit 32 to the opposing electrode 12 such that the potential difference between the pixel electrode 11 and opposing electrode 12 falls within the above-described third voltage range. That is to say, in the period from starting of image acquisition to starting of the exposure period (time t9), the photoelectric conversion layer 15 of the photoelectric conversion unit 13 is in a state where bias voltage in the third voltage range is applied.

In a state where bias voltage in the third voltage range is applied to the photoelectric conversion layer 15, any movement of signal charges from the photoelectric conversion layer 15 to the charge accumulation region hardly occurs. The reason is estimated to be that in the state where bias voltage of the third voltage range is applied to the photoelectric conversion layer 15, almost all of the positive and negative changes generated by irradiation by light rapidly recouple, and vanish before being collected by the pixel electrode 11. Accordingly, even in a case where light enters the photoelectric conversion layer 15, accumulation of signals charges to the charge accumulation region hardly occurs at all in the state where the bias voltage of the third voltage range is applied to the photoelectric conversion layer 15. Thus, occurrence of unintended sensitivity (may be referred to as "parasitic sensitivity" in the present specification) in a period other than an exposure period is suppressed. In this way, the fact that sensitivity can be quickly dropped to 0 by setting the bias voltage to the photoelectric conversion layer 15 to fall within the third voltage range is a finding that has been first discovered by the present inventors.

When focusing on a certain row in FIG. 6 (row R0 for example), the periods of rectangles indicated by oblique lines and rectangles indicated by dots represent non-exposure periods. Note that the voltage V3 for applying bias voltage within the third voltage range to the photoelectric conversion layer 15 is not restricted to 0 V.

After resetting and reading out of pixel signals for all rows in the pixel array PA has ended, the exposure period is started based on the horizontal synchronization signal Hss (time t9). The white rectangles in FIG. 6 schematically represent exposure periods at each row. The exposure period is started by the voltage supply circuit 32 switching the voltage to be applied to the opposing electrode 12 to a voltage Ve that is different from the voltage V3. The voltage Ve typically is a voltage where the potential difference between the pixel electrode 11 and opposing electrode 12 falls within the above-described first voltage range (e.g., around 10 V). Due to the voltage Ve being applied to the opposing electrode 12, signal changes in the photoelectric conversion layer 15 (holes in this example) are collected by the pixel electrode 11 and accumulated in the charge accumulation region (may be referred to as charge accumulation node 41).

The voltage supply circuit 32 switches the voltage applied to the opposing electrode 12 to the voltage V3 again, whereby the exposure period ends (time t13). Thus, in the embodiment according to the present disclosure, the exposure period and non-exposure period are switched by switching the voltage applied to the opposing electrode 12 between voltage V3 and voltage Ve. It can be seen from FIG. 6 that the start (time t9) and end (time t13) of the exposure period is held in common among all pixels included in the pixel array PA. That is to say, the operations described here are an example of a global shutter applied to the imaging device 100.

Next, readout of signal charges from the pixels belonging to each of the rows in the pixel array PA is started, based on the horizontal synchronization signal Hss. In this example, readout of signals charges from pixels belonging to the rows of row R0 through R7 is sequentially performed in increments of rows, from time t15. Hereinafter, a period from the time when pixels belonging to a certain row are selected to the time when pixels belonging to that row are selected again may be referred to as "1 V period". A period from time t0 to time t15 is equivalent to 1 V period in this example.

In the readout of signal charges from the pixels belonging to the row R0 after the exposure period ends, the address transistor 26 of the row R0 is turned on. Accordingly, pixel signals corresponding to the amount of charges accumulated in the charge accumulation region during the exposure period are output to the vertical signal line 47. Following readout of the pixel signals, the reset transistor 28 may be turned on to reset the pixels. After readout of the pixel signals, the address transistor 26 (and reset transistor 28) are turned off. After readout of the signal changes from the pixels belonging to each of the rows on the pixel array PA, the differences between signals from the signal charges and signals read out during time t0 to t9 are obtained, thereby yielding signals from which static noise has been removed.

Since voltage V3 is applied to the opposing electrode 12 during the non-exposure period, the photoelectric conversion layer 15 of the photoelectric conversion unit 13 is in a state where bias voltage within the third voltage range is applied thereto. Accordingly, further accumulation of signal charges to the charge accumulation region hardly occurs even if light enters the photoelectric conversion layer 15. Accordingly, occurrence of noise due to inclusion of unintended changes is suppressed.

An arrangement may be conceived where the exposure period is ended by applying voltage, which has an inverted polarity of the above-described voltage Ve, to the opposing electrode 12, from the perspective of suppressing further accumulation of signal charges to the charge accumulation region. However, simply inverting the polarity of the voltage applied to the opposing electrode 12 may cause movement of already-accumulated signal charges to the opposing electrode 12 via the photoelectric conversion layer 15. Movement of signal charges to the opposing electrode 12 via the photoelectric conversion layer 15 will be observed as black spots in the acquired image. That is to say, movement of signal charges from the charge accumulation region to the opposing electrode 12 via the photoelectric conversion layer 15 can become the cause of negative parasitic sensitivity.

In this example, since the voltage applied to the opposing electrode 12 is changed to voltage V3 again after the exposure period has ended, the photoelectric conversion layer 15, after accumulation of signal charges to the charge accumulation region, is in a state where the bias voltage in the third voltage range is applied. In the state where bias voltage in the third voltage range is applied, signal charges already accumulated in the charge accumulation region can be suppressed from moving to the opposing electrode 12 via the photoelectric conversion layer 15. In other words, signal changes accumulated during the exposure period can be held in the charge accumulation region by application of the bias voltage in the third voltage range to the photoelectric conversion layer 15. That is to say, occurrence of negative parasitic sensitivity due to loss of signal charges from the charge accumulation region can be suppressed.

Thus, the starting and ending of the exposure period is controlled by voltage Vb applied to the opposing electrode 12 in the embodiment of the present disclosure. That is to say, functions of a global shutter can be realized by the embodiment of the present disclosure without providing transfer transistors and so forth within each unit pixel cell 10. An electronic shutter is executed in the embodiment of the present disclosure by controlling the voltage Vb without transferring signal charges via a transfer transistor, so higher speed operations can be realized. Also, the transfer transistor and the like do not have to be provided within each unit pixel cell 10, which is advantageous in miniaturization of pixels.

Application Example

In the example of operations described with reference to FIG. 6, one exposure period is set in common for all pixels within 1 V period, and one image is acquired based on signal charges accumulated within that exposure period. In such operations, the total amount of time needed to acquire pixel signals necessary for forming a final image, that is, one frame worth of image can be said to be approximately equal to (1 V period)+(number of rows in pixel array PA)×(readout time of signals), "×" meaning multiplication. The total amount of time needed to acquire pixel signals necessary for forming one frame worth of image will be referred to as "one frame period" in the present specification. In the example illustrated in FIG. 6, the readout period for signals is equally set to one H period for each of the rows in the pixel array PA, so one frame period can be said to be (1V÷8×1 H).

In the example illustrated in FIG. 6, one exposure period is set in common for all pixels in one frame period. However, multiple exposure periods may be set in common for all pixels in one frame period. In other words, multiple exposure may be performed, with one frame image finally being formed. The path of an object that has moved during one frame period (hereinafter may be referred to as "moving body") can be recorded during the recording of one frame in multiple exposure. Multiple exposure is useful in analysis of moving bodies and analysis of high-speed phenomena. Hereinafter, an image formed based on pixel singals obtained by executing multiple exposure will be referred to as a "multiple-exposure image".

Figure 7:
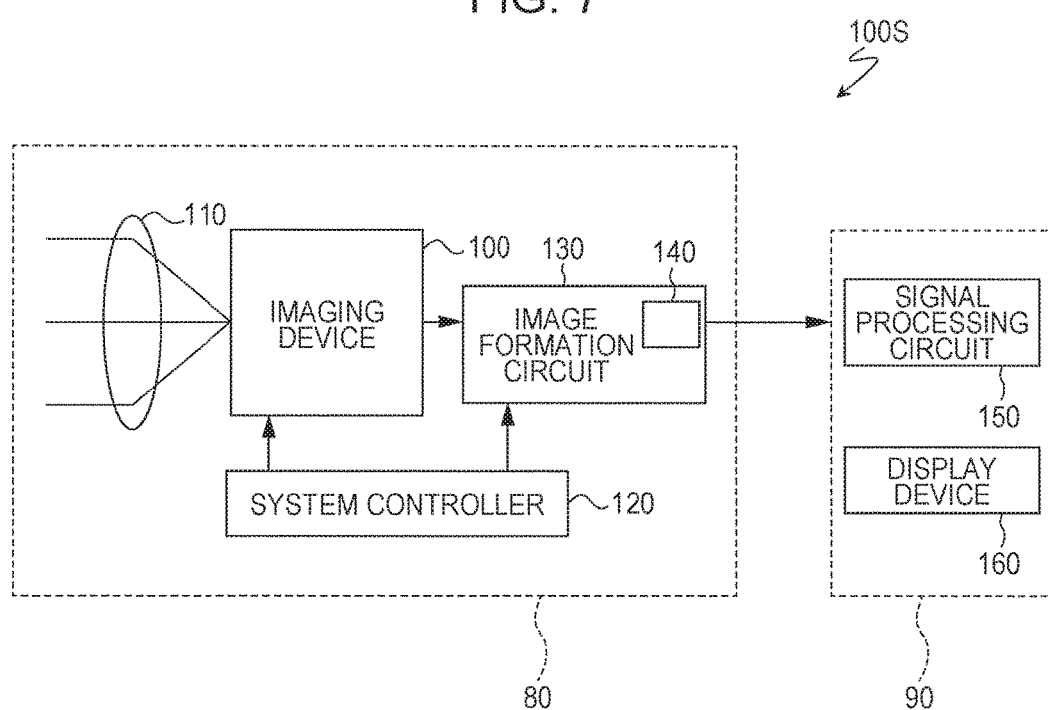
FIG. 7 is a block diagram illustrating an example of an imaging system configured to be capable of multiple-exposure images.

FIG. 7 schematically illustrates an example of an imaging system configured to be able to form multiple-exposure images. The imaging system 100S exemplified in FIG. 7 schematically includes a camera unit 80 and a display unit 90. The camera unit 80 and display unit 90 may be two parts of a single device, or each may be independent and separate devices. In the configuration exemplified in FIG. 7, the camera unit 80 has an optical system 110, an imaging device 100, a system controller 120, and an image formation circuit 130. The display unit 90 includes a signal processing circuit 150 and a display device 160.

The optical system 110 of the camera unit 80 includes a diaphragm, an image stabilization lens, zoom lens, focusing lens, and so forth. The number of lenses that the optical system 110 has is decided as appropriate in accordance with the functions that are required. The system controller 120 controls the various parts of the camera unit 80. The system controller 120 typically is a semiconductor integrated circuit such as a central processing unit (CPU) or the like, and sends out control signals to a lens driving circuit in the optical system 110, for example. The system controller 120 in this example also controls the operations of the imaging device 100. For example, the system controller 120 controls driving of the vertical scan circuit 36. Switching of voltage applied from the voltage supply circuit 32 to the sensitivity control line 42 may be executed based on control by the system controller 120. The system controller 120 may include one or more memory devices. The image formation circuit 130 is configured to form a multiple-exposure image based on output of the imaging device 100. The image formation circuit 130 may be a digital signal processor (DSP), field-programmable gate array (FPGA), or the like, for example. The image formation circuit 130 may include memory. The operations of the image formation circuit 130 may be controlled by the system controller 120. An example of formation of a multiple-exposure image will be described later.

The image formation circuit 130 has an output buffer 140 in the configuration exemplified in FIG. 7. The image formation circuit 130 outputs data of a multiple-exposure image to the display unit 90 via the output buffer 140. The data output from the image formation circuit 130 typically is RAW data, that is, 12 bit wide, for example. Data output from the image formation circuit 130 may be data compressed confirming to the H.264 standard, for example.

The signal processing circuit 150 of the display unit 90 receives output from the image formation circuit 130. The output from the image formation circuit 130 may be temporarily saved in an external recording medium configured to be detachably connected to the camera unit 80 (e.g., flash memory). That is to say, output from the image formation circuit 130 may be handed to the display unit 90 via the external recording medium.

The signal processing circuit 150 performs processing such as gamma correction, color interpolation, spatial interpolation, auto white valance, and so forth. The signal processing circuit 150 typically is a DSP, an image signal processor (ISP), or the like. The display device 160 of the display unit 90 is a liquid crystal display, organic EL (electroluminescence) display, or the like. The display device 160 displays images based on output signals from the signal processing circuit 150. The display unit 90 may be a personal computer, smartphone, or the like.

Figure 8:
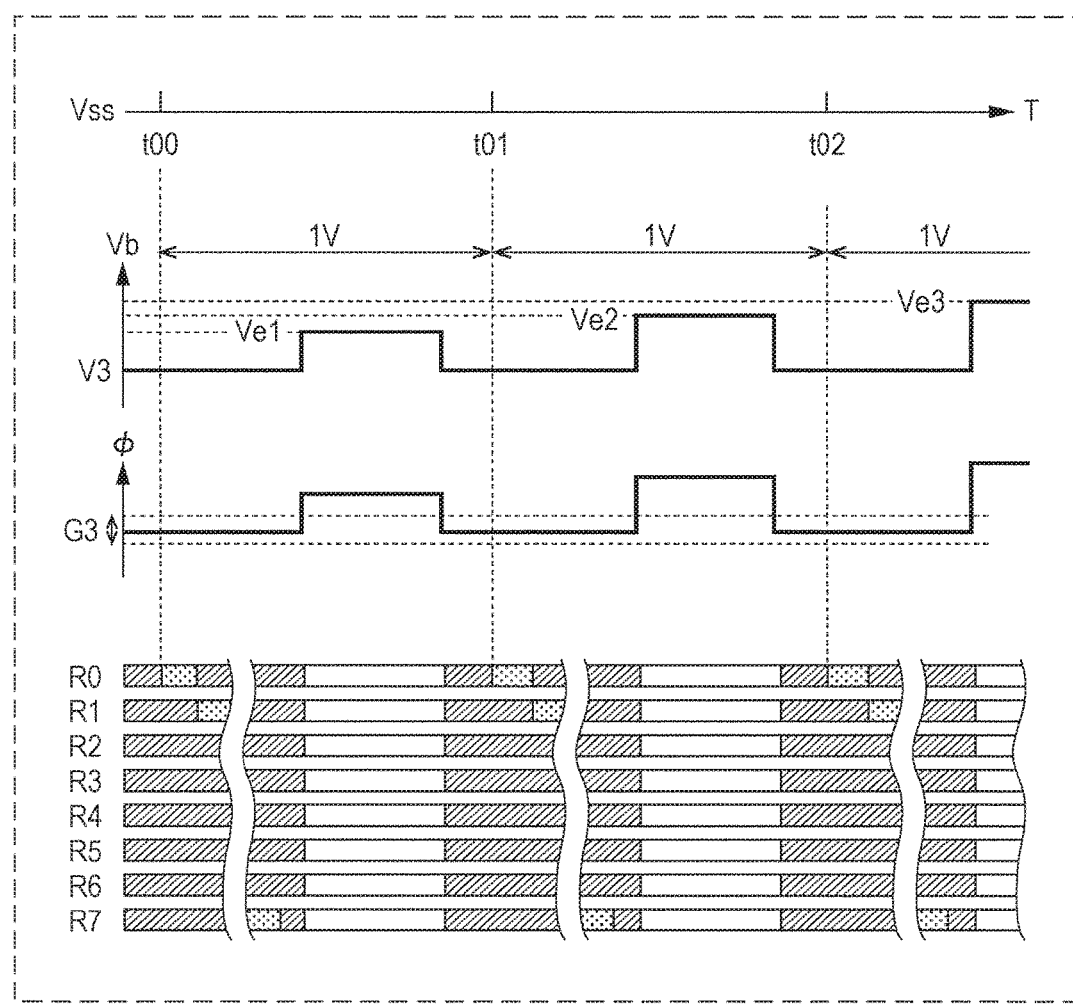
FIG. 8 is a diagram for describing an example of forming a multiple-exposure image.

An example of forming a multiple-exposure image will be described below with reference to FIGS. 8 through 12. FIG. 8 is a diagram for describing an example of forming a multiple-exposure image. Exposure is executed multiple times in the formation of one frame worth of a multiple-exposure image. First, resetting of pixels belonging to the rows of row R0 through row R7 and readout of pixel signals in accordance with the vertical synchronization signal Vss is sequentially executed in increments of rows, as illustrated in FIG. 8 (time t0). The voltage supply circuit 32 (see FIG. 1) applies voltage V3 such that the potential difference between the pixel electrode 11 and opposing electrode 12 falls within the above-described third voltage range.

Next, the voltage applied to the opposing electrode 12 is switched to voltage Ve1, thereby starting the exposure period of all pixels in the pixel array PA in common. The voltage Ve1 is a voltage where the potential difference between the pixel electrode 11 and opposing electrode 12 falls within the above-described first voltage range, for example. Applying the voltage Ve1 to the opposing electrode 12 causes one of positive and negative charges (signal charges) generated by photoelectric conversion to be accumulated in the charge accumulation region. The exposure period ends by the voltage supply circuit 32 switching the voltage applied to the opposing electrode 12 to voltage V3 again.

Next, readout of pixel signals of pixels belonging to the rows of row R0 through row R7 in accordance with the vertical synchronization signal Vss is sequentially executed in increments of rows (time t01). Accordingly, image data corresponding to the exposure period between time t00 and time t01 is acquired. The image data acquired at this time is temporarily saved in memory of the image formation circuit 130 (see FIG. 7), for example. In this example, resetting of the pixels belonging to the rows of row R0 through row R7 is performed again after readout of the pixel signals.

After executing the second reset, the voltage applied to the opposing electrode 12 is switched to voltage Ve2, thereby starting the second exposure period of all pixels in the pixel array PA in common. The second exposure period ends by the voltage supply circuit 32 switching the voltage applied to the opposing electrode 12 to voltage V3 again. After the second exposure period has ended, readout of pixel signals of pixels belonging to the rows of row R0 through row R7 is sequentially executed in increments of rows (time t02), whereby image data corresponding to the second exposure period is acquired. The point of the image data acquired at this time being temporarily saved in memory of the image formation circuit 130 for example, and the point of resetting of the pixels belonging to the rows of row R0 through row R7 being performed again after readout of the pixel signals, are the same as acquisition of image data corresponding to the first exposure period.

Thereafter, the same operations are repeated for a desired number of times. This yields multiple sets of image data corresponding to the exposure periods. The image formation circuit 130 overlays these multiple sets of image data, thereby forming a multiple-exposure image.

Voltages of mutually different magnitudes may be supplied from the voltage supply circuit 32 to the opposing electrode 12 for each of the exposure periods, during the acquisition of multiple sets of image data to form a multiple-exposure image, as illustrated in FIG. 8. The voltage supply circuit 32 applies voltages Ve1, Ve2, and Ve3, to the opposing electrode 12 over the multiple exposure periods in the example illustrated in FIG. 8. Ve1<Ve2<Ve3 is satisfied here. In a multiple-exposure image, an image of a subject that moves during one frame period appears at different positions in the image. Each of the images of the moving body appearing in the multiple-exposure image can be imparted with change in display properties by changing the bias voltage applied to the photoelectric conversion layer 15 for each exposure period, as in the example described here. For example, the lightness may be changed among each of the images of the moving body appearing in the multiple-exposure image. Display attributes changed by change in bias voltage for each exposure period typically are at least one of lightness and color (hue or chroma).

Figure 9:
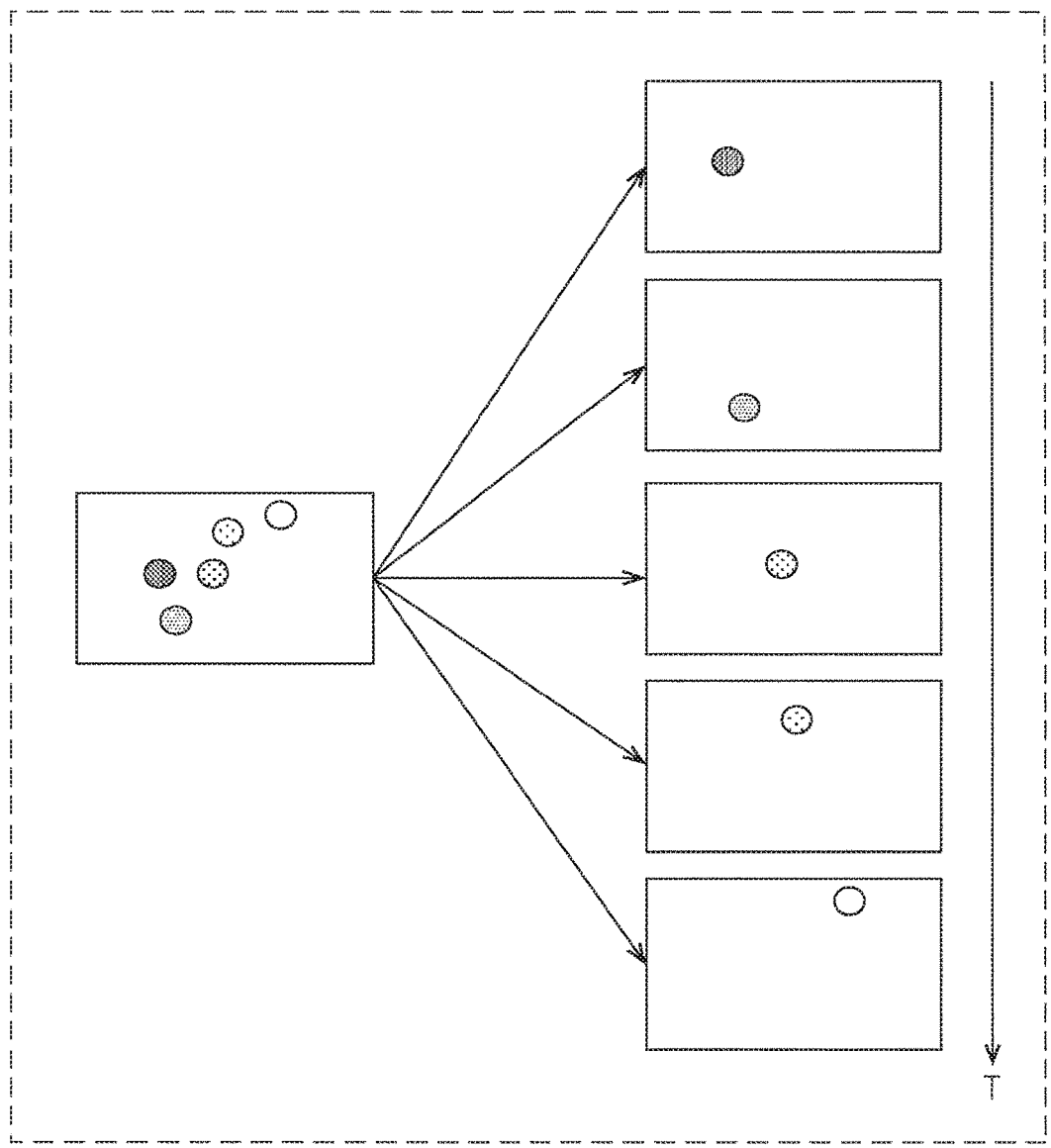
FIG. 9 is a diagram illustrating together an exemplary multiple-exposure image acquired by the imaging system illustrated in FIG. 7, and multiple images, extracted in time-series from the multiple-exposure image, each including one image of a moving body.

FIG. 9 illustrate together an exemplary multiple-exposure image acquired by the imaging system 100S, and images each including one image of a moving body that have been extracted in time series from the multiple-exposure image. FIG. 9 is an example of five exposure periods being included in one frame period.

In a multiple-exposure image obtained by changing the bias voltage applied to the photoelectric conversion layer 15 for each exposure period, as illustrated to the left side in FIG. 9, the display attributes are different for each of the images of the moving body. Accordingly, a string of multiple images indicating the way in which the moving body has moved can be constructed from the multiple-exposure image, as illustrated to the right side in FIG. 9. Accordingly, overlaying multiple sets of image data obtained by changing bias voltage during the exposure periods to form a multiple-exposure image enables information regarding the way in which the moving body has moved during the one frame period (path, change in speed, etc.) to be included in the multiple-exposure image. According to this photography method, increase in the amount of data can be suppressed as a case of sending multiple sets of image data corresponding to each of the exposure periods. Note that change in voltage supplied by the voltage supply circuit 32 during the exposure periods may be monotonous increase as illustrated in FIG. 8, monotonous decrease, or random.

Figure 10:
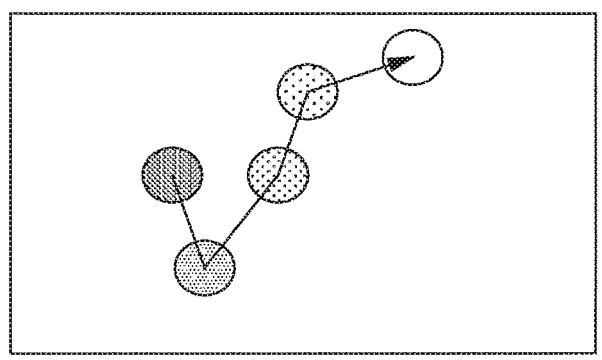
FIG. 10 is a diagram illustrating an example of a multiple-exposure image, where an image of an identifier indicating temporal change of the position of the moving body has been superimposed.
Figure 11:
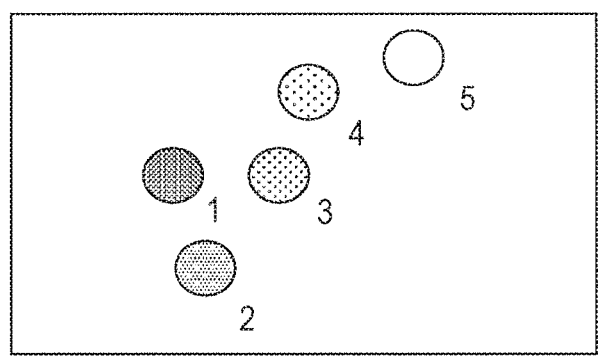
FIG. 11 is a diagram illustrating another example of a multiple-exposure image, where an image of an identifier indicating temporal change of the position of the moving body has been superimposed.

An image of an identifier indicating temporal change of the position of the moving body may be superimposed on the multiple-exposure image, as illustrated in FIGS. 10 and 11. In the example illustrated in FIG. 10, an arrow connecting the centers of the multiple images of the moving body is superimposed as the identifier indicating temporal change of the position of the moving body. In the example illustrated in FIG. 11, numerals are superimposed as the identifier indicating temporal change of the position of the moving body. Images of the moving body included in the multiple-exposure image exhibit display properties corresponding to the exposure periods. Accordingly, analyzing the display attributes of the images of the moving body included in the multiple-exposure image enables identifiers to be provided after formation of the multiple-exposure image. Text, symbols, or the like may be used as identifiers instead of numerals. Superimposing of the identifier image may be executed by the image formation circuit 130.

Signal charges accumulated in the charge accumulation region are read out in accordance with each exposure period in the example described with reference to FIG. 8. However, an arrangement may be made where exposure is performed multiple times, and signal charges accumulated in the charge accumulation region over one entire frame period are read out to form a multiple-exposure image.

Figure 12:
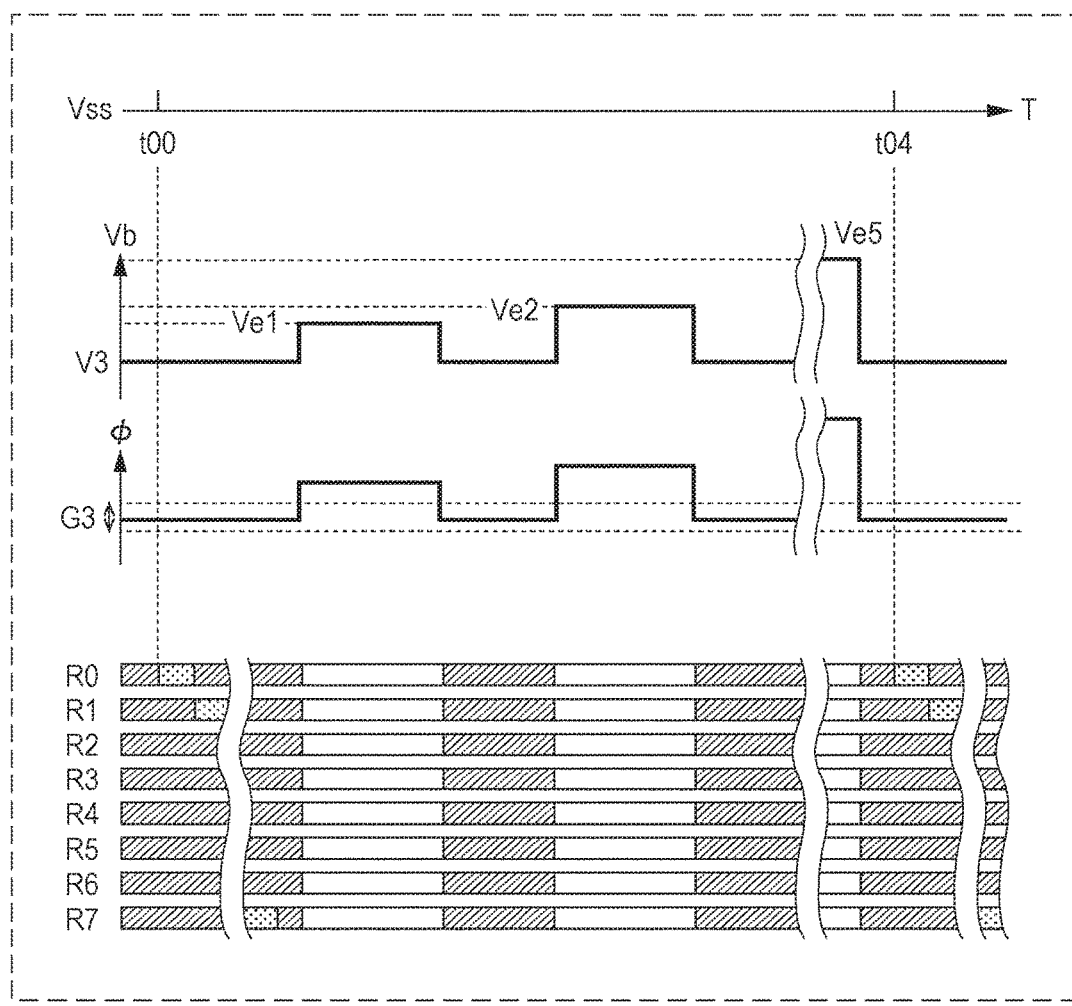
FIG. 12 is a diagram for describing another example of forming a multiple-exposure image.

FIG. 12 is a diagram for describing another example of forming a multiple-exposure image. In the example illustrated in FIG. 12, first, resetting of pixels belonging to the rows of row R0 through row R7 and readout of pixel signals in accordance with the vertical synchronization signal Vss is sequentially executed in increments of rows (time t00). Next, voltage Ve1 is applied to the opposing electrode 12, thereby executing the first exposure. After the first exposure period, no readout of pixel signals of the pixels is performed, and voltage Ve2 (Ve2>Ve1 here) is applied to the opposing electrode 12, thereby executing the second exposure. Accordingly, signal charges corresponding to the second exposure period are further accumulated in the charge accumulation region, in addition to the signal charges already accumulated therein. Such accumulation of signal charges is executed a predetermined number of times, while changing the magnitude of voltage applied to the opposing electrode 12 during the exposure periods. The number of exposures is five times in this example, with a voltage Ve5 that is different from both Ve1 and Ve2 (Ve1<Ve2< . . . Ve5) being applied to the opposing electrode 12 in the fifth exposure period.

After the fifth exposure period has ended, readout of pixel signals is executed based on the vertical synchronization signal Vss (time t04). That is to say, readout of the total signal charges accumulated over multiple exposure periods from the signal detection circuit 14 is performed once during one frame period. In this way, the image formation circuit 130 may form a multiple-exposure image based on conclusively acquired pixel signals, instead of compositing multiple sets of image data corresponding to each exposure period.

The image formation circuit 130 is not restricted to a processing circuit dedicated to forming multiple-exposure images. Forming of multiple-exposure images may be realized by a combination of a general-purpose processing circuit and a program describing processing for forming multiple-exposure images. This program may be stored in memory of the image formation circuit 130, memory of the system controller 120, or the like.

Modifications of Imaging Device

Referencing FIG. 2 again, a global shutter is realized in the embodiment of the present disclosure by different voltages being applied to the opposing electrode 12 between exposure periods and non-exposure periods, as described earlier. In a non-exposure period, the voltage supply circuit 32 (see FIG. 1) supplies voltage such that the bias voltage applied to the photoelectric conversion layer 15 falls within the above-described third voltage range, to the opposing electrode 12 via the sensitivity control line 42. On the other hand, the potential of the pixel electrode 11 during a non-exposure period is decided by the reset voltage Vr supplied to the charge accumulation region that partially includes the pixel electrode 11 and impurity region 28d. As described earlier, the reset voltage Vr is supplied to the charge accumulation region via the reset transistor 28 that has the impurity region 28d as its drain region (or source region). The reset transistor 28 has functions of switching between supply and cutoff of the reset voltage Vr to the charge accumulation region.

In the configuration exemplarily illustrated in FIG. 2, the reset voltage Vr is supplied from the reset voltage source 34 (see FIG. 1) to the impurity region 28s that is the source region (or drain region) of the reset transistor 28. The reset voltage source 34 and voltage supply circuit 32 may be commonalized. Note however, that it is advantageous that the voltage supply circuit 32 and reset voltage source 34 can independently supply voltages of different magnitudes as described later.

Figure 13:
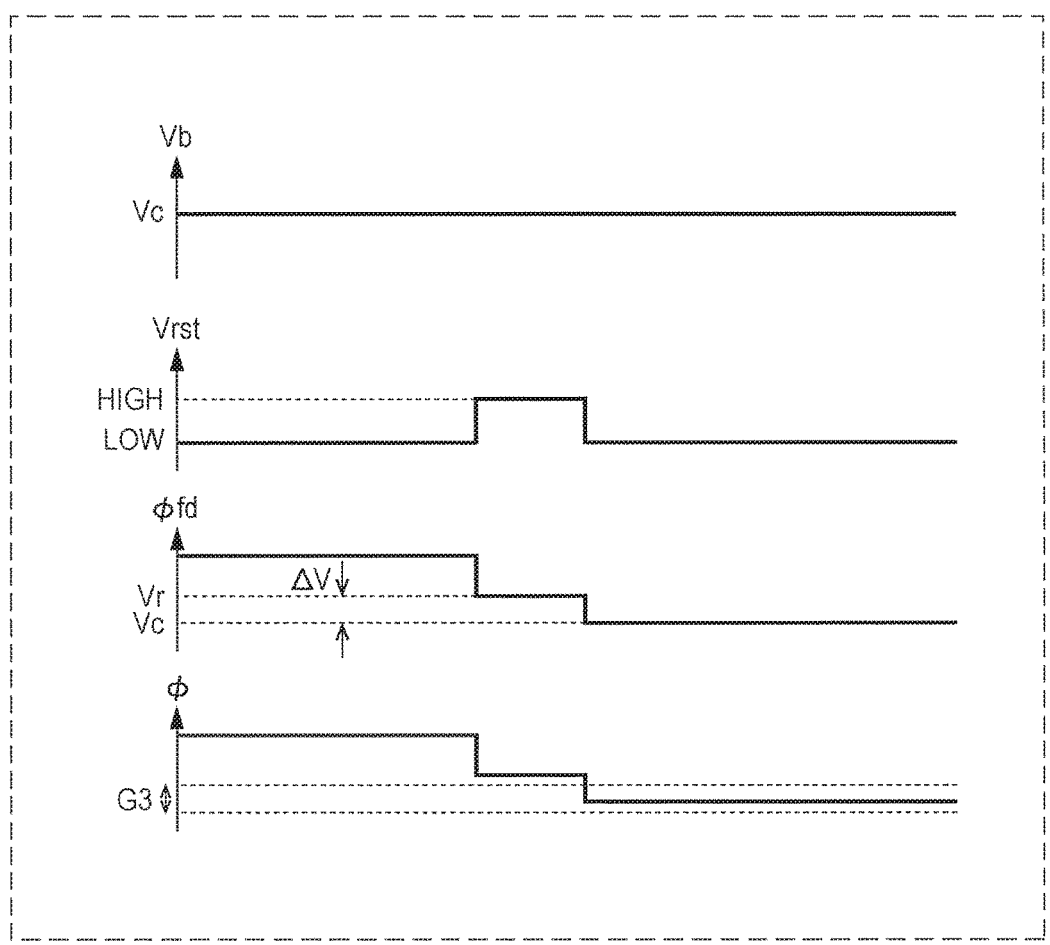
FIG. 13 is a timing chart for describing exemplary operations of a reset voltage source in a reset period.

FIG. 13 is a timing chart for describing exemplary operations of the reset voltage source 34 during the reset period. The topmost graph in FIG. 13 illustrates an example of temporal change of voltage Vb applied from the voltage supply circuit 32 to the opposing electrode 12, and the second graph illustrates change in voltage level Vrst at the reset control line 48 connected to the gate of the reset transistor 28. The graph third from the top illustrates temporal change of potential $\phi fd$ of the charge accumulation region. The temporal change of the potential $\phi fd$ can be said to be representing temporal change of the potential of the pixel electrode 11. Temporal change of potential $\phi$ at the opposing electrode 12 with the potential of the pixel electrode 11 as a reference, is illustrated below the graph illustrating the temporal change of potential $\phi fd$.

Voltage Vc applied to the opposing electrode 12 in a signal readout period including a reset period therein is typically constant, as illustrated in the graph of voltage Vb in FIG. 13. When the voltage of the reset control line 48 becomes high level in this state, the potential φfd of the charge accumulation region is reset to Vr by the application of the reset voltage Vr via the reset transistor 28. Accordingly, it would seem that if Vc=Vr is satisfied, which is to say that if the same voltage as the voltage Vc applied to the opposing electrode 12 is used as the reset voltage Vr, the potential difference between the pixel electrode 11 and opposing electrode 12 after resetting would be expected to be 0.

However, in reality, when the voltage of the reset control line 48 is set to low level and the reset transistor 28 turns off, the potential φfd of the charge accumulation region changes due to coupling between the charge accumulation region and the reset transistor 28. In this example, the potential φfd of the charge accumulation region drops by ΔV (ΔV>0) due to turning-off of the reset transistor 28. Accordingly, when the voltage Vc applied to the opposing electrode 12 during the signal readout period is simply set to be the same as the reset voltage Vr, the potential difference between the pixel electrode 11 and opposing electrode 12 after resetting may be outside of the third voltage range. A situation where the potential difference between the pixel electrode 11 and opposing electrode 12 after resetting is outside of the third voltage range will result in parasitic sensitivity.

Accordingly, a voltage greater than the voltage Vc applied to the opposing electrode 12 during the signal readout period may be used as the reset voltage Vr. For example, using a voltage where ΔV is added to the voltage Vc applied to the opposing electrode 12 as the reset voltage Vr, taking into consideration the voltage drop at the charge accumulation region due to coupling, enables the potential difference between the pixel electrode 11 and opposing electrode 12 after resetting to be brought nearer to 0, and sensitivity due to electric coupling to be cancelled out.

The specific value of ΔV depends primarily on the characteristics of the reset transistor 28 (typically the parasitic capacitance between source and gate), and the value can be known beforehand. For example, ΔV may be measured before shipping a product, and the obtained ΔV may be written to memory (e.g., read-only memory (ROM)) connected to the system controller 120 (see FIG. 7), for example. The system controller 120 can correct the magnitude of the reset voltage Vr supplied from the reset voltage source 34 based on the value of ΔV, by referencing the ΔV stored in memory. Alternatively, the circuit configuration of the reset voltage source 34 may be adjusted in accordance with the value of ΔV, so that the output voltage is the desired voltage. Voltage supplied from the voltage supply circuit 32 to the opposing electrode 12 may also be corrected, either instead of correcting the reset voltage Vr supplied from the reset voltage source 34 or along with correction of the reset voltage Vr. Note however, that correction of the reset voltage Vr is more advantageous than correction of voltage supplied from the voltage supply circuit 32 to the opposing electrode 12, with regard to the point that correction can be performed for each pixel. Such calibration of reset voltage Vr (and/or voltage supplied to the opposing electrode 12) may be executed before shipping of the imaging device 100, or may be executed by the user of the imaging device 100.

Figure 14:
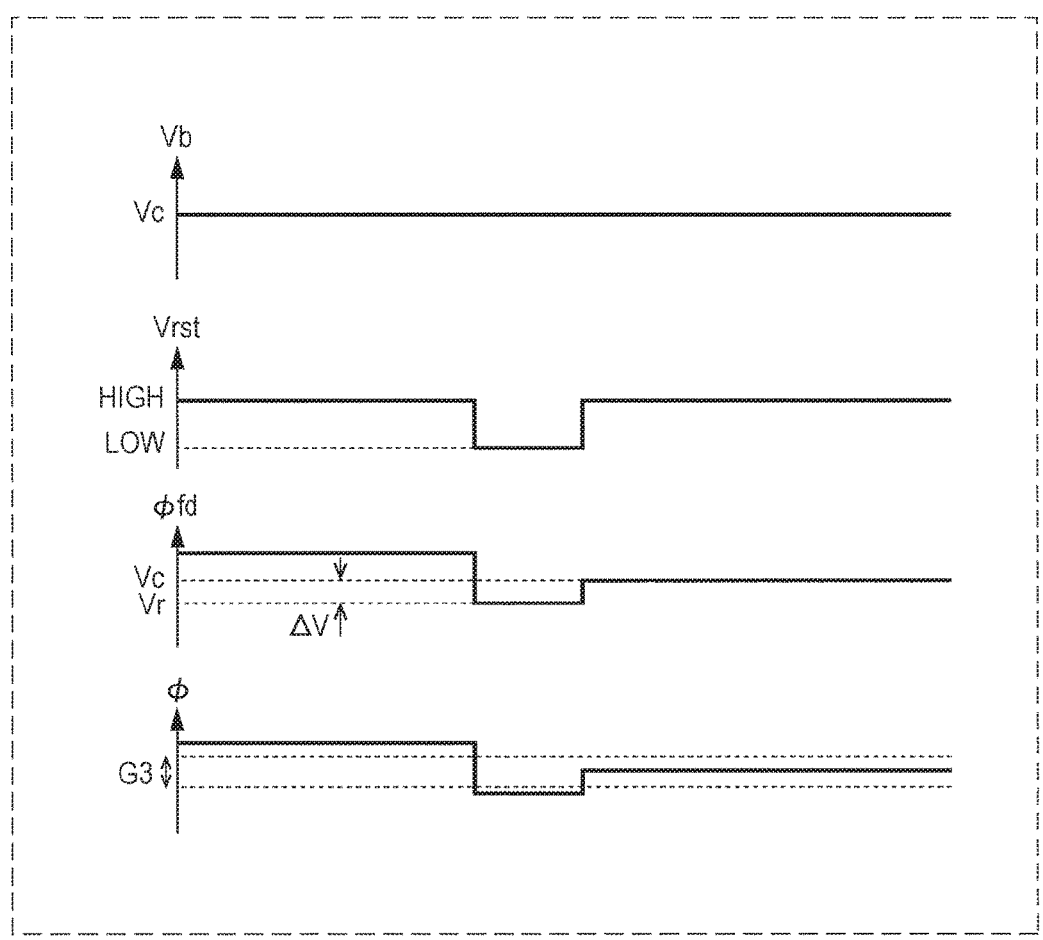
FIG. 14 is a timing chart for describing exemplary operations of the reset voltage source in a reset period.

In a case where the reset transistor 28 is a P-channel transistor, the potential φfd of the charge accumulation region rises by ΔV due to turning-off of the reset transistor 28, as illustrated in FIG. 14. Accordingly, in a case of using a P-channel transistor for the reset transistor 28, a voltage smaller than the voltage Vc applied to the opposing electrode 12 in the signal readout period may be used as the reset voltage Vr.

In the example illustrated in FIGS. 13 and 14, the potential φ of the opposing electrode 12, with the potential of the pixel electrode 11 as a reference, is outside of the third voltage range, in the period before the reset period. The voltage Vb applied from the voltage supply circuit 32 to the opposing electrode 12 does not need to be a voltage where the potential difference between the pixel electrode 11 and opposing electrode 12 is within the third voltage range through the entire non-exposure period, as illustrated in these examples. The potential φ of the opposing electrode 12 with the potential of the pixel electrode 11 as a reference may be outside of the third voltage range before resetting the pixels.

Thus, using a corrected voltage as the reset voltage Vr enables occurrence of parasitic sensitivity due to electrical coupling to be suppressed. If the correction value used at this time is too great, a great potential difference will occur between the pixel electrode 11 and the opposing electrode 12, and there is a possibility of charges in the charge accumulation region flowing to the opposing electrode 12 via the photoelectric conversion layer 15. In other words, this is a risk of backflow of charge via the photoelectric conversion layer 15. Accordingly, it is advantageous that the absolute value of the difference between the reset voltage Vr and the voltage Vc that the voltage supply circuit 32 applies to the opposing electrode 12 is smaller than the breakdown voltage of the photoelectric conversion layer 15. For example, in a case where the reset transistor 28 is an N-channel transistor, it is advantageous that the reset voltage Vr does not exceed the voltage Vc. The breakdown voltage of the photoelectric conversion layer 15 can be defined as a voltage at which the photoelectric conversion layer 15 loses its function due to charges in the charge accumulation region flowing from the pixel electrode 11 to the opposing electrode 12 via the photoelectric conversion layer 15. Alternatively, it is advantageous that the absolute value of the difference between the reset voltage Vr and the voltage Vc that the voltage supply circuit 32 applies to the opposing electrode 12 is smaller than the input voltage to the signal detection circuit 14 (typically VDD).

Figure 15:
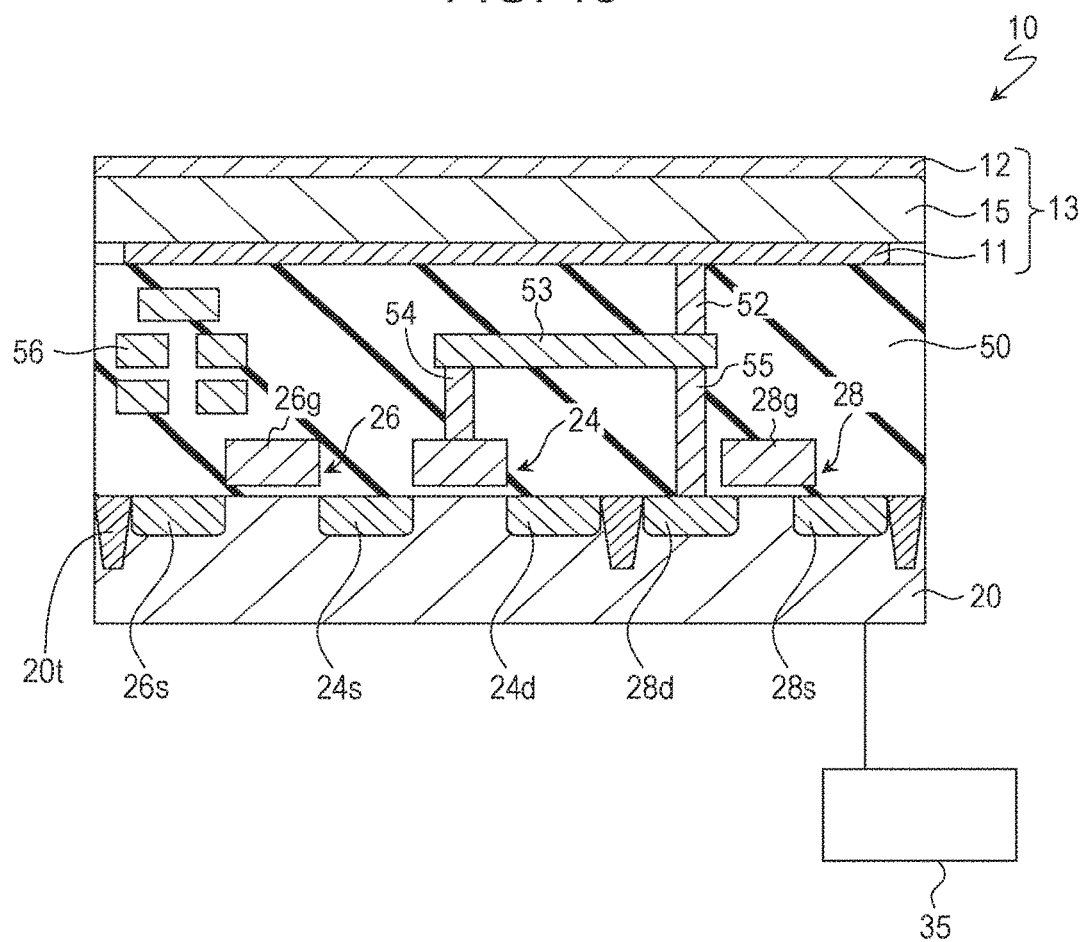
FIG. 15 is a schematic diagram illustrating a modification of an imaging device.

FIG. 15 illustrates a modification of the imaging device 100. In the configuration exemplarily illustrated in FIG. 15, the semiconductor substrate 20 has a substrate voltage supply circuit 35 that supplies a predetermined substrate voltage Vs. The substrate voltage Vs supplied from the substrate voltage supply circuit 35 is voltage that is different from 0 V.

Setting the reset voltage Vr to a voltage near 0 V enables the voltage Vc applied from the voltage supply circuit 32 to the opposing electrode 12 to be 0 V, i.e., enables the opposing electrode 12 to serve as a ground, so the circuit configuration of the imaging device 100 can be further simplified. However, if the reset voltage Vr is 0 V for example, the signal detection transistor 24 will not function as a source-follower, so signal voltage cannot be read out.

In the configuration exemplified in FIG. 15, substrate voltage Vs that is different from 0 V is applied to the semiconductor substrate 20. For example, a negative voltage is applied to the semiconductor substrate 20 as substrate voltage Vs, thereby shifting the substrate potential. Shifting the substrate potential enables both suppression of dark current and linearity at the signal detection circuit 14 to be realized, even in a case where the reset voltage Vr, and the voltage Vc applied from the voltage supply circuit 32 to the opposing electrode 12, are 0 V. The substrate voltage supply circuit 35 may be commonalized with the above-described voltage supply circuit 32 and/or reset voltage source 34. An arrangement where the voltage Vc that is applied from the voltage supply circuit 32 to the opposing electrode 12 is positive voltage enables the same advances as a case where the reset voltage Vr and voltage Vc are set to 0 V to be obtained, while avoiding application of negative voltage to the semiconductor substrate 20.

As described above, according to the embodiment of the present disclosure, controlling the voltage applied to the opposing electrode 12 enables accumulation and storage of charges to the charge accumulation region to be controlled. Thus, a global shutter function can be realized with a simpler device structure.

Various other modifications besides the above-described examples can be made to the imaging device according to the embodiment of the present disclosure. For example, global shutter driving and rolling shutter driving may be switched in accordance with the subject. In rolling shutter driving, the voltage that the voltage supply circuit 32 applies to the opposing electrode 12 can be fixed to voltage Ve for both exposure period and non-exposure period. The exposure period can be stipulated here by the period from the time of resetting the charge accumulation node 41 to the time of readout of signals.

Each of the above-described signal detection transistor 24, address transistor 26, and reset transistor 28, may be N-channel MOS, or P-channel MOS. There is no need for all of these to be unified to N-channel MOS or P-channel MOS. Bipolar transistors may be used as the signal detection transistor 24 and/or address transistor 26, besides field-effect transistors.

The imaging device according to the present disclosure is applicable to image sensors and the like, for example. The imaging device according to the present disclosure can be used in medical cameras, robot cameras, security cameras, vehicle onboard-use cameras, and so forth. Vehicle onboard-use cameras can be used as input as to a control device, for safe traveling of the vehicle. Alternatively, vehicle onboard-use cameras may be used for support of an operator, for safe traveling of the vehicle.

What is claimed is:

1. An imaging device comprising:
   unit pixel cells each including a first electrode, a second electrode facing the first electrode, a photoelectric conversion layer between the first electrode and the second electrode, a charge accumulation region electrically connected to the first electrode, and a signal detection circuit electrically connected to the charge accumulation region; and
   a voltage supply circuit electrically connected to the second electrode, the voltage supply circuit supplying a first voltage to the second electrode in a first period, the voltage supply circuit supplying a second voltage that is different from the first voltage to the second electrode in a second period different from the first period, wherein
   the unit pixel cells each include a reset transistor that is electrically connected to the charge accumulation region, the reset transistor switching between supply and cutoff of a reset voltage for initializing the charge accumulation region, and
   a potential difference between the first electrode and the second electrode when the reset voltage is supplied is greater than a potential difference between the first electrode and the second electrode after the reset voltage is cut off.

2. The imaging device according to claim 1, wherein the reset transistor is an n-channel field-effect transistor, and
   the reset voltage is greater than the second voltage.

3. The imaging device according to claim 1, wherein the reset transistor is a p-channel field-effect transistor, and
   the reset voltage is smaller than the second voltage.

4. The imaging device according to claim 1, wherein the unit pixel cells are two-dimensionally arrayed in rows and columns, and
   signals detected by the signal detection circuits of the unit pixel cells are read out at different timings for each of the rows.

5. The imaging device according to claim 1, wherein the first period is one of a plurality of first periods, and the plurality of the first periods are included in one frame period.

6. The imaging device according to claim 5, wherein the voltage supply circuit supplies the first voltage to the second electrode at mutually different magnitudes among the plurality of first periods.

7. The imaging device according to claim 5, further comprising:
   an image forming circuit that acquires a plurality of sets of image data based on each output from the signal detection circuit at the plurality of first periods, and forms a multiple-exposure image by superimposing the plurality of sets of image data.

8. The imaging device according to claim 5, further comprising:
   an image forming circuit that acquires a signal from the signal detection circuit, the signal corresponding to signal charges accumulated in the charge accumulation region in the one frame period, the image forming circuit forming a multiple-exposure image based on the signal.

9. The imaging device according to claim 1, wherein the first period is a period for accumulating charges generated by photoelectric conversion in the charge accumulation region.

10. The imaging device according to claim 9, wherein the start and end of the first period is common to the unit pixel cells.

11. The imaging device according to claim 9, wherein the reset transistor switches between supply and cutoff of the reset voltage for initializing the charge accumulation region in the second period.

12. The imaging device according to claim 11, wherein the start and end of the first period is common to the pixels.

13. An imaging device comprising:
    pixels each including a first electrode, a second electrode facing the first electrode, a photoelectric conversion layer between the first electrode and the second electrode, and a reset transistor that is electrically connected to the first electrode, the reset transistor switching between supply and cutoff of a reset voltage for initializing a voltage of the first electrode; and
    a voltage supply circuit electrically connected to the second electrode, the voltage supply circuit supplying a first voltage to the second electrode in a first period, the voltage supply circuit supplying a second voltage that is different from the first voltage to the second electrode in a second period different from the first period, wherein a potential difference between the first electrode and the second electrode when the reset voltage is supplied is greater than a potential difference between the first electrode and the second electrode after the reset voltage is cut off.

14. The imaging device according to claim 13, wherein the reset transistor is an n-channel field-effect transistor, and the reset voltage is greater than the second voltage.

15. The imaging device according to claim 13, wherein the reset transistor is a p-channel field-effect transistor, and the reset voltage is smaller than the second voltage.

16. The imaging device according to claim 13, wherein the pixels are two-dimensionally arrayed in rows and columns, and signals from the pixels are read out at different timings for each of the rows.

17. The imaging device according to claim 13, wherein the first period is one of a plurality of first periods, and the plurality of the first periods are included in one frame period.

18. The imaging device according to claim 17, wherein the voltage supply circuit supplies the first voltage to the second electrode at mutually different magnitudes among the plurality of first periods.

19. The imaging device according to claim 13, wherein the pixels each include a charge accumulation region electrically connected to the first electrode, and the first period is a period for accumulating charges generated by photoelectric conversion in the charge accumulation region.

20. The imaging device according to claim 19, wherein the reset transistor switches between supply and cutoff of the reset voltage for initializing the voltage of the first electrode in the second period.

* * * * *